(12) United States Patent
Kanomata

(10) Patent No.: US 10,483,957 B2
(45) Date of Patent: Nov. 19, 2019

(54) SEMICONDUCTOR DEVICE

(71) Applicant: RENESAS ELECTRONICS CORPORATION, Tokyo (JP)

(72) Inventor: Kazuto Kanomata, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 79 days.

(21) Appl. No.: 15/702,341

(22) Filed: Sep. 12, 2017

(65) Prior Publication Data
US 2018/0083607 A1    Mar. 22, 2018

(30) Foreign Application Priority Data

Sep. 16, 2016  (JP) ................................ 2016-181410

(51) Int. Cl.
| | | |
|---|---|---|
| H04L 25/03 | (2006.01) | |
| H03K 5/22 | (2006.01) | |
| G06F 1/04 | (2006.01) | |
| H03K 5/01 | (2006.01) | |
| H03K 5/00 | (2006.01) | |

(52) U.S. Cl.
CPC ................. *H03K 5/22* (2013.01); *G06F 1/04* (2013.01); *H03K 5/01* (2013.01); *H04L 25/03057* (2013.01); *H04L 25/03885* (2013.01); *H03K 2005/00019* (2013.01); *H03K 2005/00286* (2013.01); *H04L 2025/0349* (2013.01)

(58) Field of Classification Search
CPC .. H03K 5/22; H03K 5/01; H03K 2005/00019; H03K 2005/00286; H04L 25/03885; H04L 25/03057; H04L 2025/0349; G06F 1/04

See application file for complete search history.

(56) References Cited

U.S. PATENT DOCUMENTS

| | | | |
|---|---|---|---|
| 2008/0240224 A1* | 10/2008 | Carballo | ........... H04L 25/03057 375/233 |
| 2010/0327924 A1 | 12/2010 | Hasegawa et al. | |

(Continued)

FOREIGN PATENT DOCUMENTS

JP     2011-151765 A     8/2011

OTHER PUBLICATIONS

European Search Report issued in corresponding European Application No. 17188232.7, dated Jan. 18, 2018.

*Primary Examiner* — Siu M Lee
(74) *Attorney, Agent, or Firm* — McDermott Will & Emery LLP

(57) ABSTRACT

The present invention provides a semiconductor device capable of properly performing equalization even when the transfer rate of serial data is changed. A semiconductor device includes: an addition circuit of adding input data and feedback data and outputting addition data; a first sampling circuit of sampling the addition data from the addition circuit and outputting sampling data; a multiplication circuit of multiplying the sampling data from the first sampling circuit by a tap coefficient to generate the feedback data; a tap coefficient determination circuit determining the tap coefficient on the basis of the sampling data from the first sampling circuit; and a calibration circuit of adjusting a delay time since the first sampling circuit outputs the sampling data until the addition data corresponding to the output sampling data is supplied to the first sampling circuit.

5 Claims, 10 Drawing Sheets

(56) References Cited

U.S. PATENT DOCUMENTS

2011/0090947 A1    4/2011  Peng et al.
2016/0080178 A1*  3/2016  Chen ................. H04L 25/03057
                                                                       375/233
2016/0261435 A1*  9/2016  Musah .............. H04L 25/03019

* cited by examiner

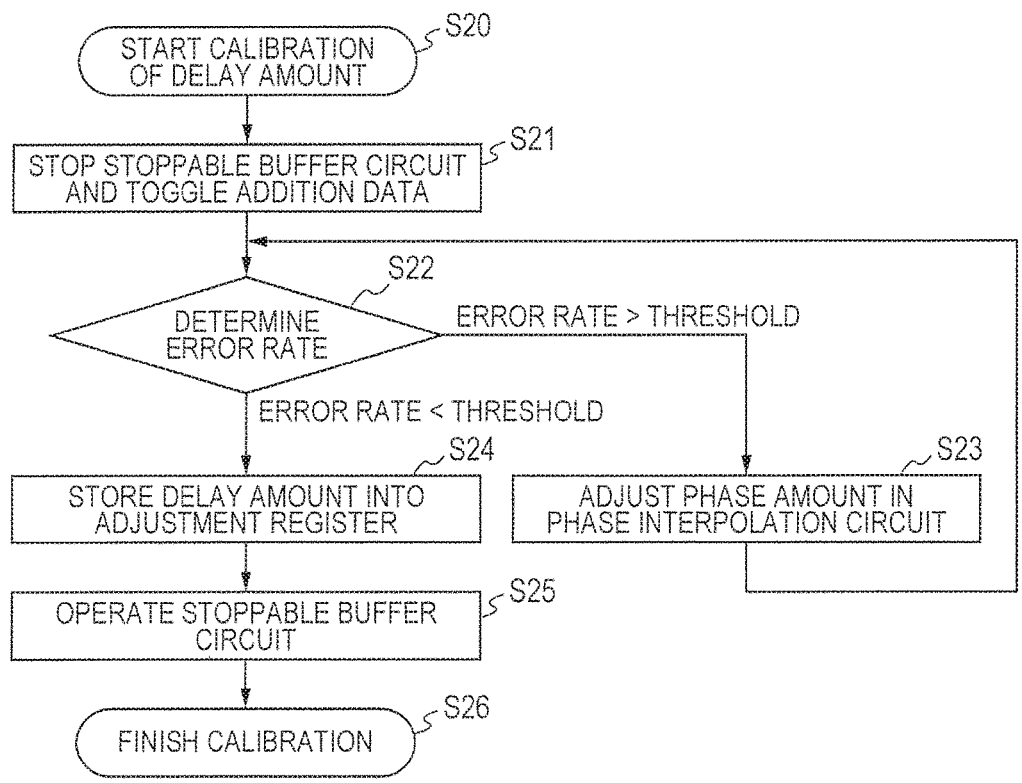
FIG. 5
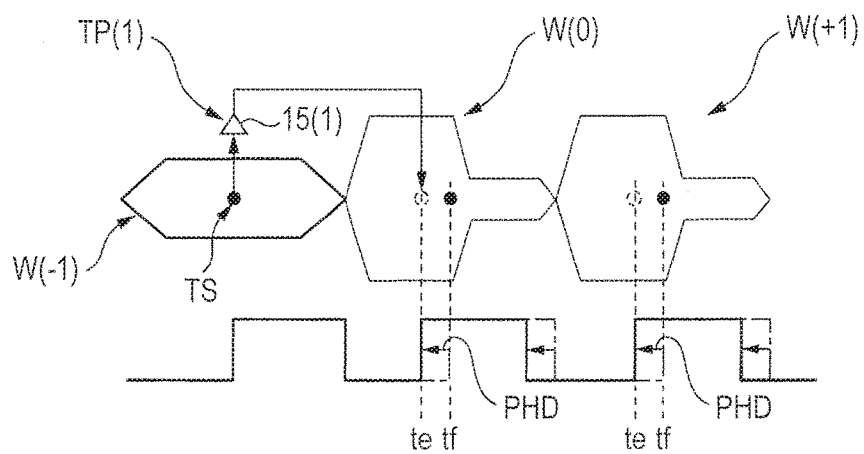
FIG. 6A
FIG. 6B

SEMICONDUCTOR DEVICE

CROSS-REFERENCE TO RELATED APPLICATIONS

The disclosure of Japanese Patent Application No. 2016-181410 filed on Sep. 16, 2016 including the specification, drawings and abstract is incorporated herein by reference in its entirety.

BACKGROUND

The present invention relates to a semiconductor device and, particularly, relates to a semiconductor device having a feedback equalizer.

A feedback equalizer equalizing a waveform by using data which is preceding in time (in the past) is known. As feedback equalizers, for example, feedback equalizers of various configurations such as a decision feedback equalizer (hereinbelow, also called DFE) exist.

A DFE is provided for, for example, a SerDes (SERializer/DESelializer) circuit performing mutual conversion between serial data and parallel data and used to equalize the waveform of serial data.

The SerDes circuit is provided on the inside of a semiconductor device and is mounted on, for example, a card of PCI Express. PCI Express includes a plurality of standards of different transfer rates. In standard PCI Express 1.1 (hereinbelow, standard Gen1), the transfer rate is 2.5 Gbps. In standard PCI Express 2.0 (hereinbelow, standard Gen2), the transfer rate is 5 Gbps. In standard PCI Express 3.0 (hereinbelow, standard Gen3), the transfer rate is 8 Gbps. In standard PCI Express 4.0 (hereinbelow, standard Gen4), the transfer rate is 16 Gbps. The DFE in the SerDes circuit mounted on the PCI Express card is required to operate at a transfer rate adapted to the standard employed to the card.

The DFE is described in, for example, patent literature 1.

RELATED ART LITERATURE

Patent Literature

[Patent Literature 1]
Japanese Unexamined Patent Application Publication No. 2011-151765

SUMMARY

A DFE is comprised of, for example, an analog circuit and a digital circuit. In FIG. 1 of the patent literature 1, a DFE (80) is comprised of an analog circuit, and a tap coefficient decision circuit (90) and a data filter circuit (10) are comprised of digital circuits. When a plurality of kinds of DFEs having such a configuration are designed and/or manufactured in accordance with the standards Gen1 to Gen4, time required for designing is increased, and it is difficult to reduce manufacture cost. The above reference numerals in the parenthesis are reference numerals used in FIG. 1 of the patent literature 1.

Consequently, the inventors of the present invention considered to reduce the time required to the designing and manufacture cost by preparing a DFE conformed with the standard Gen4 of the highest transfer rate and using DFEs prepared also in the standards Gen1 to Gen3 of low transfer rates. However, in this case, for example, delay time required in an analog circuit as a component of a DFE varies according to a transfer rate. Therefore, a problem that it becomes difficult to perform proper equalization occurs.

In the patent literature 1, the configuration of the DFE is described. However, it is not recognized and, of course, not described that when the DFE is used at different transfer rates, it becomes difficult to perform proper equalization.

The other problem and novel features will become apparent from the description of the specification and the appended drawings.

A semiconductor device according to an embodiment has a feedback equalizer. The feedback equalizer has an addition circuit of adding input data and feedback data and outputting addition data, a first sampling circuit of sampling the addition data from the addition circuit and outputting sampling data, a multiplication circuit of multiplying the sampling data from the first sampling circuit by a tap coefficient to generate feedback data, a tap coefficient determination circuit determining a tap coefficient on the basis of the sampling data from the first sampling circuit, and a calibration circuit. The calibration circuit adjusts a delay time since the first sampling circuit outputs the sampling data until addition data corresponding to the sampling data is supplied to the first sampling circuit or a sampling timing of the first sampling circuit.

According to the embodiment, a semiconductor device capable of performing proper equalization even if the transfer rate (transfer speed) of serial data is changed can be provided.

BRIEF DESCRIPTION OF THE DRAWINGS

FIG. 5 is a flowchart illustrating operations in a calibration mode according to the second embodiment.

FIGS. 6A and 6B are waveform charts illustrating operations of the DFE according to the second embodiment.

DETAILED DESCRIPTION

Figure 1:
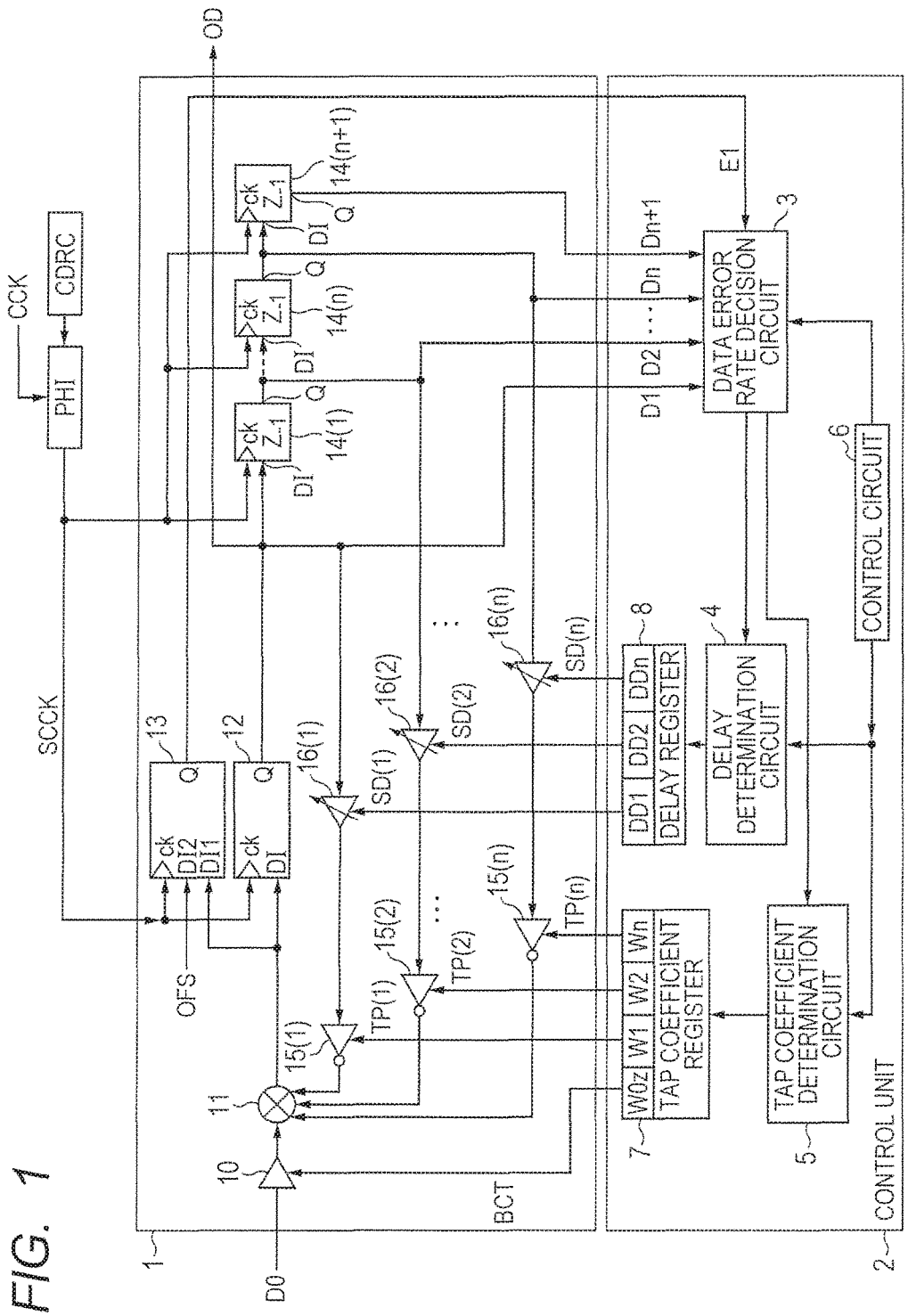
FIG. 1 is a block diagram illustrating the configuration of a DFE according to a first embodiment.

Hereinafter, embodiments of the present invention will be described in detail. In all of the diagrams for explaining the embodiments, the same reference numerals are designated to the same parts in principle, and their repetitive description will not be repeated in principle.

First Embodiment

To facilitate understanding of the embodiments, first, basic operation of a DFE and a problem in the case where the transfer rate of serial data changes will be described.

Basic Operation of DFE

Figure 11A:
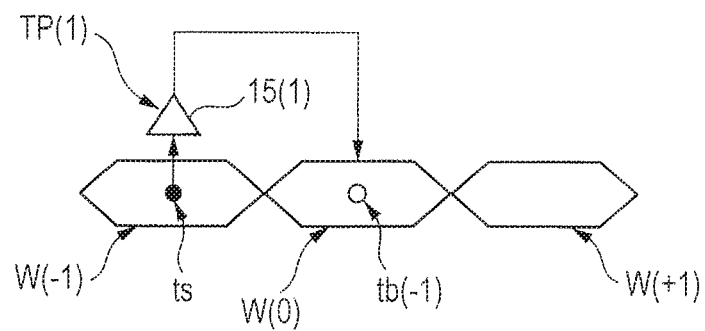
FIGS. 11A to 11C are explanatory diagrams illustrating basic operations of the DFE.
Figure 11B:
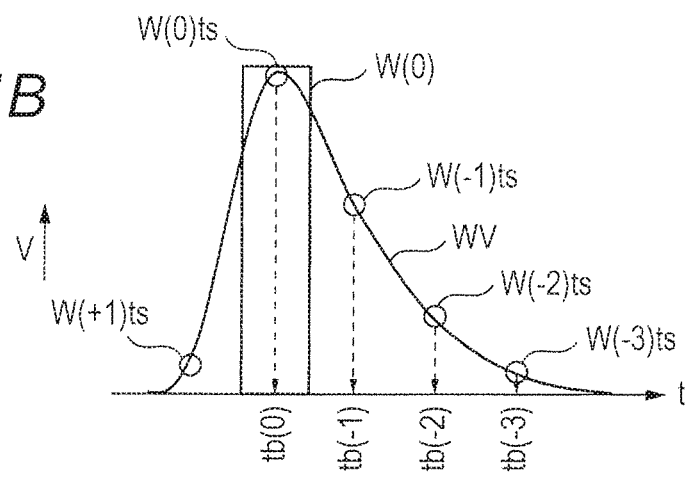
Figure 11C:
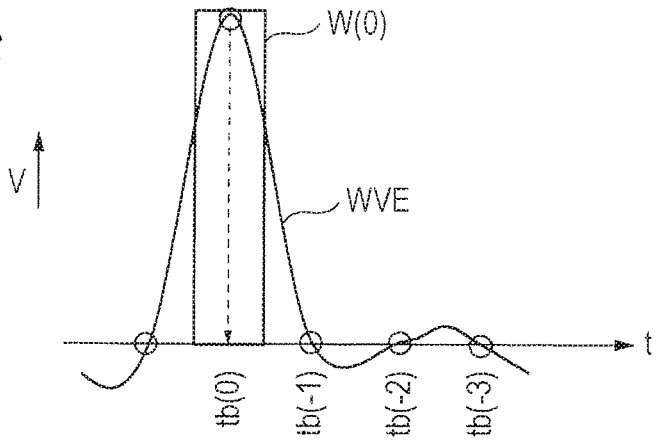

FIGS. 11A to 11C are explanatory diagrams illustrating basic operations of a DFE. FIG. 11A is an explanatory diagram schematically illustrating equalization of waveforms in the DFE. FIG. 11B is a waveform chart illustrating the waveform of output data which is output from an output terminal of a signal line when input data having a rectangular waveform is supplied to an input terminal of the signal line. FIG. 11C is a waveform chart illustrating the waveform of output data shaped by equalizing a transmission characteristic of the signal line by the DFE. To facilitate explanation, the case that a rectangular waveform is supplied to an input terminal of a signal line and a waveform of an impulse response is equalized will be described.

In FIG. 11A, W(0) indicates the waveform of input data at present, and W(−1) indicates the waveform of input data earlier than the present time (in the past). W(+1) indicates the waveform of input data later than the present time (in future). In the DFE, by adding (subtracting) feedback data obtained by multiplying the input data in the past by a tap coefficient to/from the input data at the present, the waveform of output data corresponding to the present input data is shaped. By the operation, the transmission characteristics of the signal line are equalized. In the following description, it is assumed that feedback data is added. However, by inverting feedback data and adding it, addition substantially means subtraction. In FIG. 11A, the waveforms W(−1), W(0), and W(+1) of input data are drawn as eye patterns.

In the case where the waveform W(0) of input data having a rectangular shape as illustrated in FIG. 1 is supplied to the input terminal of the signal line, according to the transmission characteristics of the signal line, the waveform of output data output from the output terminal of the signal line deteriorates, and the waveform becomes, for example, the waveform indicated by WV in FIG. 11B, different from the waveform W(0) of the input data. In the DFE, in FIG. 11A, the waveform W(−1) of input data in the past is sampled at a predetermined timing ts. The sampling data obtained by the sampling and a tap coefficient TP(1) are multiplied by a multiplication circuit 15(1) to generate feedback data, and the feedback data is added to (subtracted from) the present waveform W(0) at a predetermined timing tb(−1)). When the transmission characteristics of the signal line are constant with respect to time, feedback data obtained by multiplying sampling data by the proper tap coefficient TP(1) indicates a value W(−1) ts of a waveform WV at the predetermined timing tb(−1)). Consequently, by inverting the value W(−1) ts indicated by the feedback data and adding the resultant to the waveform WV, distortion of the waveform is shaped at the predetermined timing tb(−1)) as illustrated in FIG. 11C.

Similarly, although not illustrated, also with respect to waveforms W(−2) and W(−3) of input data in the past, when those waveforms are supplied, they are sampled and multiplied by proper tap coefficients to generate feedback data indicating values W(−2)ts and W(−3)ts of the waveform WV at predetermined timings tb(−2)) and tb(−3)), respectively. By adding the feedback data to the waveform WV at the timings tb(−2)) and tb(−3)), the waveform is shaped at the timings tb(−2)) and tb(−3)) as illustrated in FIG. 11C. As a result, the transmission characteristics of the signal line are equalized and output data of the shaped waveform WVE is obtained as illustrated in FIG. 11C.

In FIGS. 11A to 11C, the horizontal axis indicates time, and the vertical axis indicates voltage.

Problem in the Case Where Transfer Rate Changes

Next, a problem in the case where the transfer rate changes, that is, the case of equalizing serial data of different transfer rates will be described. An example of the case of equalizing serial data of different transfer rates is a case of preparing a DFE conformed with the standard Gen4 of the highest transfer rate as a so-called macro circuit and using it also as DFEs of other standards Gen1 to Gen3.

Figure 12A:
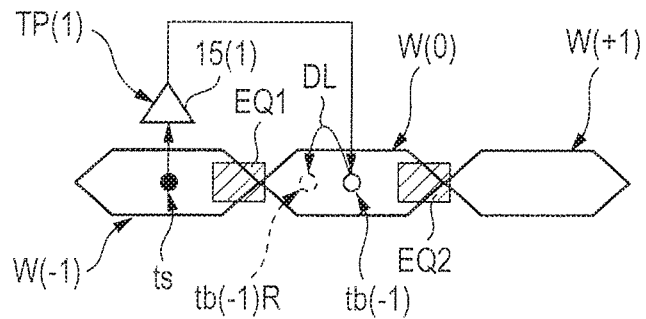
FIGS. 12A to 12C are explanatory diagrams explaining a problem of the DFE.
Figure 12B:
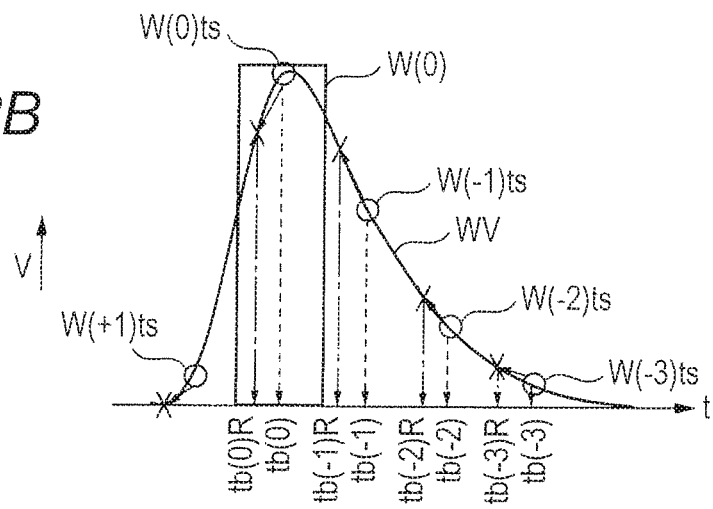
Figure 12C:
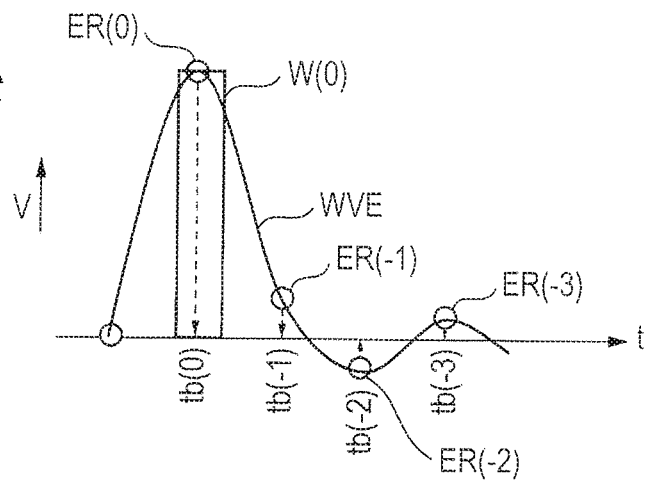

FIGS. 12A to 12C are explanatory diagrams explaining the problem of the DFE. FIGS. 12A to 12C are similar to FIGS. 11A to 11C, and the same reference characters and numerals are designated to the same parts. In FIG. 12A, the multiplication circuit 15(1) is comprised of an analog circuit. Delay time of the multiplication circuit 15(1) is set so that the waveform W(−1) of input data in the past is sampled at the predetermined timing ts and present input data and feedback data is added at the predetermined timing tb(−1)). Delay time of not-illustrated multiplication circuits corresponding to the waveforms W(−2) and W(−3) of input data in the past is also set so that the waveforms are sampled at the predetermined timing ts and the present input data and the feedback data is added at the predetermined timings tb(−2)) and tb(−3)).

Since the multiplication circuit 15(1) is comprised of an analog circuit, even when the transfer rate of the serial data changes, delay time is almost constant. That is, although the cycle of the waveform of the input signal supplied as serial data changes when the transfer rate changes, the delay time of the multiplication circuit 15(1) is almost constant.

In the DFE for the standard Gen4, the delay time of the multiplication circuit 15(1) is set so that, after sampling at the timing ts, feedback data is added to input data at the timing tb(−1)) so as to be able to equalize serial data of the transfer rate of the standard Gen4. When the DFE for the standard Gen4 is used also for the standards Gen1 to Gen3, the timing of adding feedback data to input data becomes earlier. In FIG. 12A, the timing of addition becomes earlier only by time DL and changes to the timing tb(−1))R.

Since the timing of addition becomes earlier, the value W(−1)ts of the feedback data added at the timing tb(−1)) in the standard Gen4 is added (X mark) to the waveform WV at the timing tb(−1))R as illustrated in FIG. 12B. Since the feedback data is inverted and added, the equalized waveform WVE becomes as illustrated in FIG. 12C, the waveform WVE has a value ER(−1)) at the timing tb(−1)) and is not sufficiently shaped.

Although the multiplication circuit 15(1) has been described above, similarly, the input data W(−2) and W(−3) in the past is also added to the waveform WV not at the timings tb(−2)) and tb(−3)) but at the timings tb(−2))R and tb(−3))R, and the waveform WVE which is not sufficiently equalized is output as illustrated in FIG. 12C.

Particularly, in the multiplication circuit 15(1), the input data W(−1) which is input just before the present input data is added as feedback data to the input data W(0) at present. Consequently, time allowed to the multiplication circuit 15(1) becomes shorter than time allowed to multiplication circuits corresponding to the other input data W(−2) and W(−3). For the reason, particularly, the multiplication circuit 15(1) is comprised of an analog circuit which can shorten delay time. As understood from FIGS. 11B and 12B, the value W(−1)ts generated by the multiplication circuit 15(1) and added to the waveform WV is large. Due to this, when the timing of adding feedback data generated by the multiplication circuit 15(1) changes from a predetermined timing, the distortion of the equalized waveform becomes larger than that in the case where the timing of adding other feedback data changes. Therefore, it is important that the timing of adding feedback data particularly generated by the multiplication circuit 15(1) becomes the predetermined timing tb(−1)) as compared with the other feedback data.

Although the example of using the DFE conformed with the standard Gen4 as a macro circuit as DFEs for other standards has been described, similarly, also in the case of preparing, for example, a DFE conformed with the standard Gen1 as a macro circuit and using it as a DFE for another standard, the waveform WVE which is not sufficiently equalized is output.

Further, when the timing of addition changes to hatched regions EQ1 and EQ2 in FIG. 12A, there is the possibility that erroneous equalization is performed.

That is, when the transfer rate (transfer speed) of serial data changes, it becomes difficult to properly perform equalization, and a problem occurs such that a waveform which is not sufficiently shaped or a wrong waveform is output.

Electronic Device

Figure 10:
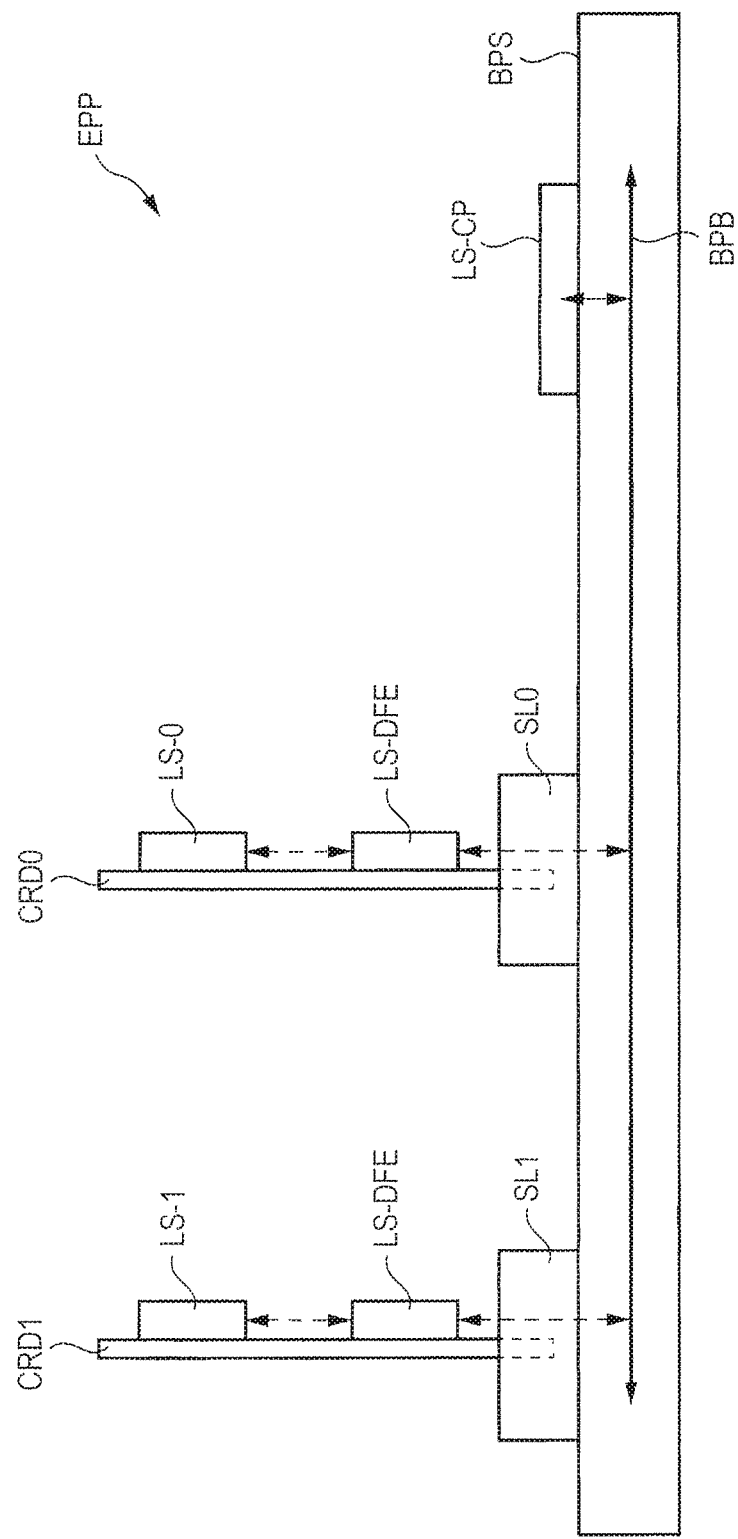
FIG. 10 is a schematic cross section illustrating the configuration of an electronic device according to the first embodiment.

Next, an example of an electronic device having the DFE according to the first embodiment will be described. FIG. 10 is a schematic cross section illustrating the configuration of an electronic device EPP according to the first embodiment. The electronic device EPP has a plurality of semiconductor devices and electronic parts mounted on a printed board BPS. On the printed board BPS, although not limited, a plurality of sockets or slots are mounted. In FIG. 10, only one semiconductor device LS-CP and two slots SL0 and SL1 mounted on the printed board BPS are drawn. In FIG. 10, BPB indicates a signal line formed in the printed board BPS.

The semiconductor device LS-CP mounted on the printed board BPS is, for example, a central processing unit and coupled to the signal line BPB. The slots SL0 and SL1 are also coupled to the signal line BPB. Via the signal line BPB, data is transmitted/received between the semiconductor device LS-CP and the slots SL0 and SL1. Into the slots SL0 and SL1, cards CRD0 and CRD1 conformed with the PCI Express standard are inserted. Although a plurality of semiconductor devices and electronic parts are mounted also on the cards CRD0 and CRD1, two semiconductor devices LS-DFE and LS-0 (LS-DFE and LS-1) mounted on the card CRD0 (CRD1) are illustrated in FIG. 10. In FIG. 10, the semiconductor devices LS-DFE mounted on the cards CRD0 and CRD1 are semiconductor devices each having a DFE on the inside, and LS-0 and LS-1 are semiconductor devices each transmitting/receiving data to/from the semiconductor device LS-DFE and performing desired process.

Between the semiconductor devices LS-DFE mounted on the cards CRD0 and CRD1 and the semiconductor device LS-CP, serial data is transmitted/received via the signal line BPB. Consequently, to the DFE mounted on the semiconductor device LS-DFE, data having a waveform distorted in accordance with the transmission characteristic of the signal line BPB is supplied as input data. In the semiconductor device LS-DFE, the signal line BPB is equalized, output data having a shaped waveform is supplied to the semiconductor devices LS-0 and LS-1, and desired process is performed in the semiconductor devices LS-0 and LS-1.

The cards CRD0 and CRD1 inserted to the slots SL0 and SL1 may be cards conformed with the same standard Gen4 or cards conformed with, for example, standards different from each other such as Gen4 and Gen1.

Configuration of Semiconductor Device LS-DFE

Figure 9:
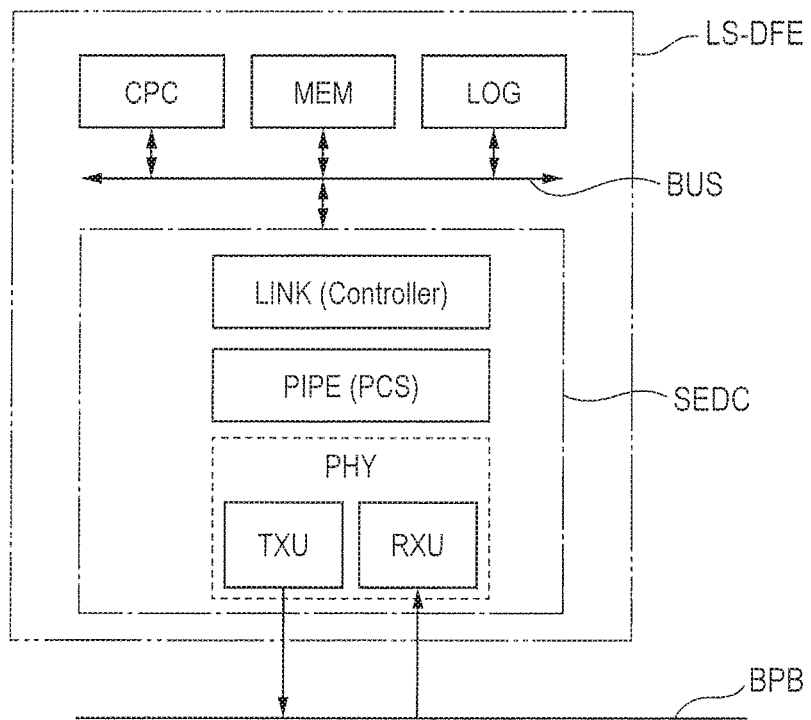
FIG. 9 is a block diagram illustrating the configuration of a semiconductor device according to the first embodiment.

FIG. 9 is a block diagram illustrating the configuration of the semiconductor device LS-DFE according to the first embodiment. The semiconductor device LS-DFE surrounded by an alternate long and two short dashes line has, although not limited, one semiconductor substrate and a plurality of circuit blocks formed on the semiconductor substrate. In FIG. 9, only circuit blocks necessary for explanation in a plurality of circuit blocks are illustrated. In FIG. 9, the semiconductor device LS-DFE has a SerDes circuit SEDC, a central processing unit CPC, memories MEM including a volatile memory and a nonvolatile memory, and a logic circuit LOG, those circuit blocks are coupled mutually via a bus BUS, and data, control signals, and the like are mutually transmitted/received.

The SerDes circuit SEDC has a physical layer PHY, a link layer LINK, and an interface PIPE. The link layer LINK is coupled to the bus BUS, and data and a control signal are transmitted/received between the SerDes circuit SEDC and the bus BUS. The interface PIPE interfaces between the physical layer PHY having the function of a PCS (Physical Coding Sublayer) and the link layer LINK. The physical layer PHY has a transmission unit TXU and a reception unit RXU and performs conversion between parallel data and serial data.

The serial data is transmitted, for example, through the signal line BPB in the printed board BPS illustrated in FIG. 10, received by the reception unit RXU, and converted to parallel data by the physical layer PHY, and the parallel data is supplied to the bus BUS via the interface PIPE and the link layer LINK. The central processing unit CPC processes the parallel data supplied to the bus BUS in accordance with a program stored in the memory MEM, and the processed data is supplied to the logic circuit LOG and the like. On the contrary, the parallel data supplied from the logic circuit LOG and the like to the bus BUS is supplied to the physical layer PHY via the link layer LINK and the interface PIPE. The parallel data supplied to the physical layer PHY is converted to serial data, and the serial data is transmitted to the signal line BPB by the transmission unit TXU.

By the above operation, in the electronic device EPP illustrated in FIG. 10, serial data is transmitted/received via the signal line BPB between the semiconductor device LS-CP and the semiconductor device LS-DFE. The semiconductor device LS-0 (LS-1) mounted on the card CRD0 (CRD1) is coupled, for example, by the logic LOG in the semiconductor device LS-DFE and transmission/reception of data and control signals between the semiconductor device LS-0 (LS-1) and the semiconductor device LS-DFE is performed via the logic LOG.

Although the electronic device EPP illustrated in FIG. 10 has been described as an example, the invention is not limited to the example. For example, the semiconductor device LS-DFE illustrated in FIG. 9 may be mounted on a printed board on which a connector is mounted, and coupled to a corresponding electronic device or semiconductor device via a cable coupled to the connector. In this case, the cable coupled to the connector functions as a signal line transmitting data. In FIG. 10, the example of using, as the semiconductor device realizing a desired function, the semiconductor device LS-0 (LS-1) different from LS-DFE has been described. Alternatively, the desired function may be achieved in the semiconductor device LS-DFE.

Configuration of Reception Unit

Figure 8:
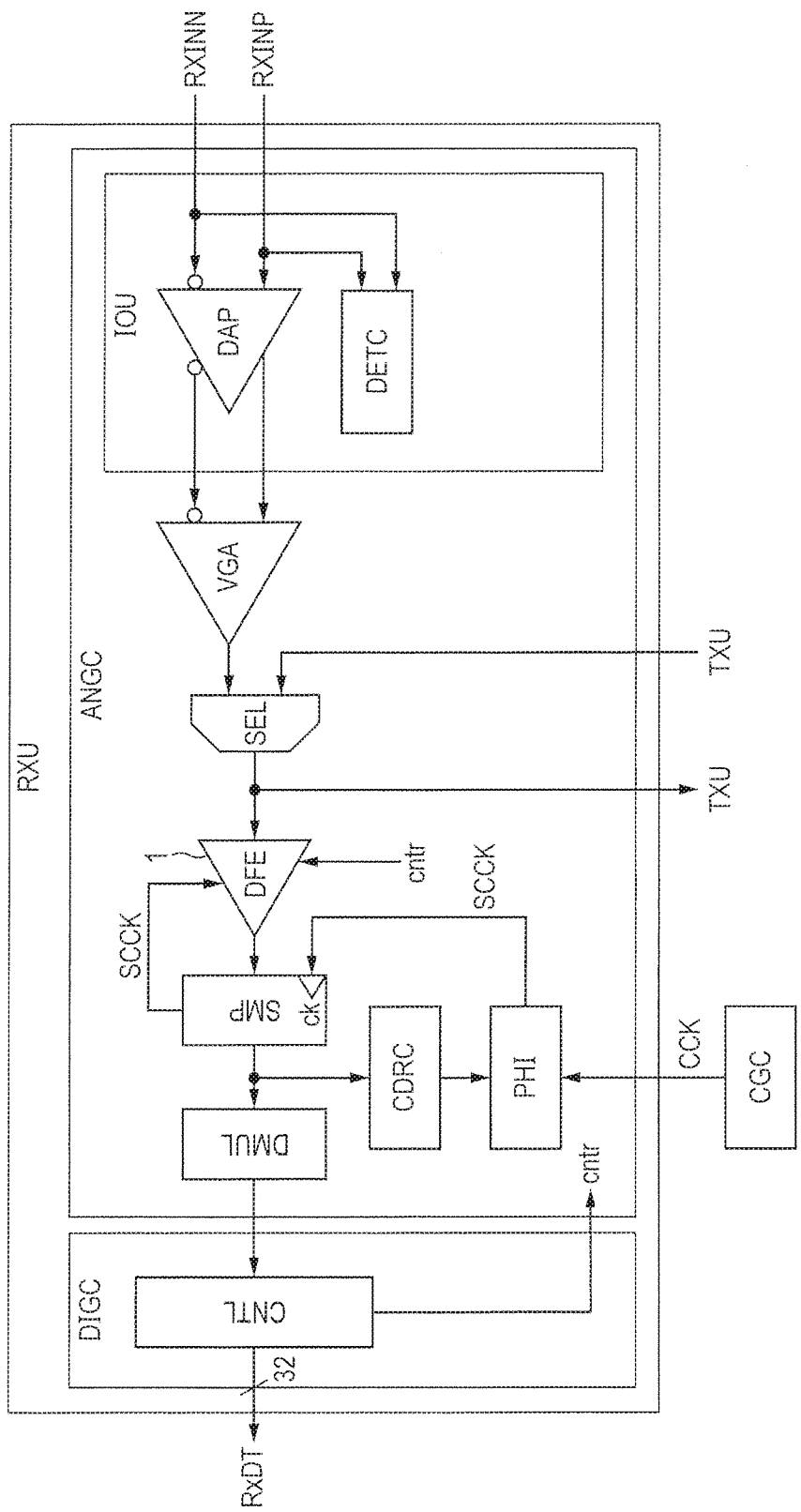
FIG. 8 is a schematic block diagram illustrating the configuration of a reception unit according to the first embodiment.

Next, the configuration of the reception unit RXU according to the first embodiment will be described. The reception unit RXU has a DFE equalizing the transmission characteristic of the signal line BPB (FIGS. 9 and 10). FIG. 8 is a schematic block diagram illustrating the configuration of the reception unit RXU according to the first embodiment. The reception unit RXU has a circuit block ANGC comprised mainly of analog circuits and a circuit block DIGC comprised mainly of digital circuits. In the first embodiment, although not limited, serial data as input data is supplied by differential signals. In FIG. 8, the differential signals are indicated by reference characters RXINN and RXINP. Specifically, the differential signals RXINN and RXINP which change complementarily to each other propagate through the signal line BPB and are supplied to the reception unit RXU.

The circuit block ANGC has an input/output circuit IOU, a linear amplification circuit VGA, selectors SEL and DFE1, a sampling circuit SMP, a demultiplexer DMUL, a CDR circuit CDR, and a phase interpolation circuit PHI.

The input/output circuit IOU has, although not limited, a differential amplification circuit DAP and a detection circuit DETC. To the differential amplification circuit DAP and the detection circuit DETC, the differential signals RXINN and RXINP are supplied. The differential amplification circuit DAP amplifies the differential signals RXINN and RXINP and outputs the amplified signals. The detection circuit DETC detects whether serial data is supplied or not by the differential signals RXINN and RXINP. Consequently, in the input/output circuit IOU, when supply of serial data is detected, the differential signals amplified by the differential amplification circuit DAP are supplied to the linear amplification circuit VGA.

By the linear amplification circuit VGA, the input data linearly amplified is supplied, although not limited, to the selector SEL in the first embodiment. When the input data amplified by the linear amplification circuit VGA is selected by the selector SEL, the input data is supplied to DFE 1. The DFE 1 equalizes the transmission characteristic of the signal line transmitted the serial data (for example, the signal line BPB illustrated in FIGS. 9 and 10) and shapes the waveform of the supplied input data. As the DFE 1 will be described in detail later, further description is not given here.

The output data whose waveform was shaped and output from the DFE 1 is supplied to the sampling circuit SMP. The sampling circuit SMP samples the output data from the DFE 1 synchronously with a clock signal supplied to a clock input terminal ck, and supplies binary sampling data obtained by the sampling to the CDR circuit CDRC and also to the demultiplexer DMUL.

The CDR circuit CDRC is a clock data recovery circuit and extracts phase information regarding the phase of a proper clock signal from the binary sampling data output from the sampling circuit SMP. The phase information extracted by the CDR circuit CDRC is supplied to the phase interpolation circuit PHI. The phase interpolation circuit PHI receives a clock signal CCK generated by the clock generation circuit CGC, adjusts the phase of the supplied clock signal CCK on the basis of the phase information from the CDR circuit CDRC, and outputs a clock signal SCCK obtained by the adjustment to the clock input terminal ck of the sampling circuit SMP and the DFE 1. By the above operations, the sampling circuit SMP can sample output data from the DFE 1 on the basis of the clock signal SCCK whose phase is properly adjusted. Also to the DFE 1, the clock signal SCCK of the proper phase is supplied. From the viewpoint of adjusting the phase, the phase interpolation circuit can be also regarded as a phase adjustment circuit.

The binary sampling data output from the sampling circuit SMP is supplied to the demultiplexer DMUL and converted to parallel data by the demultiplexer DMUL.

The parallel data from the demultiplexer DMUL is supplied to the circuit block DIGC. The circuit block DIGC has a control circuit CNTL. Although not limited, the parallel data from the demultiplexer DMUL is supplied to the control circuit CNTL, and the parallel data corresponding to the serial data supplied to the reception unit RXU via the control circuit CNTL is output as output data RxDT. The control circuit CNTL controls the DFE 1. The control is schematically drawn as a control signal cntr in FIG. 8. As will be described in detail, the DFE 1 according to the first embodiment has two kinds of modes and operates in any of the two kinds of modes by the control of the control circuit CNTL.

In the first embodiment, although not limited, transmission serial data to be transmitted from the transmission unit TXU is also supplied to the selector SEL. By selecting the transmission serial data by the selector SEL, the transmission serial data is transmitted and supplied also to the DFE 1. Obviously, in the circuit block ANGC, data output from the linear amplification circuit VGA may be supplied as input data to the DFE 1 not via the selector SEL.

Configuration of DFE

FIG. 1 is a block diagram illustrating the configuration of a DFE according to the first embodiment. In FIG. 1, 1 denotes a decision feedback equalizer (DFE) and 2 denotes a control unit controlling the DFE 1. The control unit 2 is comprised of digital circuits. Consequently, referring to FIG. 8, the control unit 2 is provided in the circuit block DIGC. Obviously, the control unit 2 may be provided for the circuit block ANGC like in the DFE 1 illustrated in FIG. 8.

The DFE 1 has a buffer circuit 10 whose operation can be stopped (hereinbelow, also called stoppable buffer circuit), an addition circuit 11, a first sampling circuit 12, a second sampling circuit 13, delay circuits 14(1) to 14(n+1), multiplication circuits 15(1) to 15(n), and variable delay circuits 16(1) to 16(n).

The DFE 1 according to the first embodiment has two operation modes; an equalization mode of equalizing input data D0 and outputting shaped output data OD, and a calibration mode of adjusting delay time in accordance with a transfer rate.

The input data D0 is supplied to the addition circuit 11 via the stoppable buffer circuit 10. The addition circuit 11 adds the input data D0 from the stoppable buffer circuit 10 and feedback data which will be described later, and outputs the resultant data. The addition data obtained by the addition circuit 11 is supplied to the first sampling circuit 12 and the second sampling circuit 13.

The first sampling circuit 12 has an input terminal DI, an output terminal Q, and a clock input terminal ck. A cyclic clock signal SCCK whose phase is adjusted is supplied from the phase interpolation circuit PHI to the clock input terminal ck of the first sampling circuit 12, and the addition data from the addition circuit 11 is supplied to the input terminal DI. The first sampling circuit 12 fetches the addition data supplied to the input terminal DI synchronously with the clock signal SCCK supplied to the clock input terminal ck, binarizes it, and outputs the resultant data from the output terminal Q. That is, the first sampling circuit 12 samples the addition data synchronously with the clock signal SCCK.

The second sampling circuit 13 has input terminals DI1 and DI2, the output terminal Q, and the clock input terminal ck. An offset OFS is supplied to the input terminal DI2, and the addition data from the addition circuit 11 is supplied to the input terminal DI1. The second sampling circuit 13 fetches the addition data synchronously with the clock signal SCCK supplied to the clock input terminal ck. At this time, using the offset OFS supplied to the second input terminal DI2 as a reference, the addition data supplied to the first input terminal DI1 is binarized. That is, the addition data is binarized by determining whether it is higher or lower than the offset OFS, and the binarized data is fetched synchronously with the clock signal SCCK. In other words, using the offset OFS as a reference, the second sampling circuit 13 samples the addition data.

The first sampling circuit 12 and the second sampling circuit 13 fetch, for example, the addition data and the addition data using the offset OFS as a reference synchronously with the rising edge of the clock signal SCCK. Specifically, synchronously with the rising edge of the clock signal SCCK, each of the first and second sampling circuits 12 and 13 samples the addition data. From the output terminal Q of the first sampling circuit 12, binary data corresponding to the fetched addition data is output as the sampling data D1 and the output data OD.

As described with reference to FIG. 8, the clock signal SCCK is generated by adjusting the phase of the clock signal CCK by the phase interpolation circuit PHI on the basis of the phase information obtained by the CDR circuit CDRC.

Each of the delay circuits 14(1) to 14 (n+1) has the clock input terminal ck, the input terminal DI, and the output terminal Q. Like the first sampling circuit 12, each of the delay circuits 14(1) to 14(n+1) also fetches data supplied to the input terminal DI synchronously with the clock signal SCCK (for example, the rising edge) and outputs data from the output terminal Q. The input terminal DI of the delay circuit 14(1) is coupled to the output terminal Q of the first sampling circuit 12, and the output terminal Q of the delay circuit 14(1) is coupled to the input terminal DI of the not-illustrated delay circuit 14(2). Similarly, the output terminal of each of the subsequent delay circuits is coupled to the input terminal of the delay circuit at the next stage, and the output terminal Q of the delay circuit 14(n) is coupled to the input terminal DI of the delay circuit 14(n+1). Specifically, the delay circuits 14(1) to 14 (n+1) are coupled in series, and the clock signal SCCK is supplied to the clock input terminals ck of the delay circuits 14(1) to 14(n+1). In such a manner, the delay circuits 14(1) to 14(n+1) configure a shift register which operates synchronously with the clock signal SCCK.

To the input terminal DI of the delay circuit 14(1) as the first stage of the shift register, the sampling data D1 is supplied from the output terminal Q of the first sampling circuit 12. Each time the clock signal SCCK changes, the sampling data D1 from the first sampling circuit 12 moves in the stages (delay circuits 14(1) to 14(n+1)) configuring the shift register, and is output as sampling data D2 to Dn+1 from the output terminals Q of the respective stages (delay circuits 14(1) to 14(n+1)).

In the case of setting the input data D0 supplied to the stoppable input buffer circuit 10 as data at the present time point, the sampling data D1 according to the input data which is before the present time point (in the past) and an error signal E1 are output from the output terminals Q of the first and second sampling circuits 12 and 13. That is, data of sampling corresponding to addition data fetched in the first and second sampling circuits 12 and 13 when the clock signal SCCK changes once before the present time point is output as the sampling data D1 and the error signal E1 from the output terminals Q.

Each time the clock signal SCCK changes, the sampling data output from the output terminal Q of the first sampling circuit 12 propagates through the delay circuits 14(1) to 14 (n+1), is stored in the delay circuits, and output. That is, the sampling data D1 according to input data which is closer in time to the input data at the present time point to the sampling data Dn+1 according to input data which is earlier in time (in the past) from the first sampling circuit 12 toward the delay circuit 14 (n+1) is output from the output terminal Q. In FIG. 1, the reference numeral $Z_{-1}$ indicated in the delay circuits 14(1) to 14(n+1) expresses delay circuits in Z transformation indication.

In the first embodiment, the output terminal Q of the first sampling circuit 12 is coupled to the multiplication circuit 15(1) via the variable delay circuit 16(1). The delay time of the variable delay circuit 16(1) is determined by delay time information SD(1). Consequently, sampling data D1 output from the output terminal Q of the first sampling circuit 12 is delayed only by the time determined by the delay time information SD(1) and the resultant data is supplied to the multiplication circuit 15(1). The multiplication circuit 15(1) performs multiplication between the supplied sampling data D1 and the tap coefficient TP(1) and outputs feedback data. In the first embodiment, the multiplication circuit 15(1) inverts the multiplication result and outputs the multiplication result obtained by the inversion as feedback data.

The output terminal Q of the delay circuit 14(1) is also coupled to the multiplication circuit 15(2) via the variable delay circuit 16(2) whose delay time is determined by delay time information SD(2). Consequently, sampling data D2 output from the output terminal Q of the delay circuit 14(1) is delayed only by time determined by the delay time information SD(2) and the resultant data is supplied to the multiplication circuit 15(2). The multiplication circuit 15(2) performs multiplication between a tap coefficient TP(2) and the supplied sampling data D2, inverts the computation result, and outputs the resultant data as feedback data. Also similarly in the rest of the plurality of delay circuits (in FIG. 1, 14(n) as an example), sampling data (Dn) output from the delay circuit (14(n)) is delayed only by time determined by delay time information (SD(n)), the resultant data is supplied to the corresponding multiplication circuit (15(n)) and, in the corresponding multiplication circuit (15(n)), multiplied with a tap coefficient (TP(n)), the resultant data is inverted, and the inverted data is output as feedback data.

The feedback data output from each of the multiplication circuits 15(1) to 15(n) is supplied to the addition circuit 11. The addition circuit 11 performs computation of addition between the feedback data and the input data D0 supplied from the stoppable buffer circuit 10. Since each of the multiplication circuits 15(1) to 15(n) outputs the inverted feedback data, the addition circuit 11 substantially functions as a subtraction circuit and functions so as to subtract the feedback data from the input data D0.

The control unit 2 has a data error rate decision circuit 3, a delay determination circuit 4, a tap coefficient determination circuit 5, a control circuit 6, a tap coefficient register 7, and a delay register 8. The data error rate decision circuit 3, the delay determination circuit 4, and the tap coefficient determination circuit 5 are controlled by the control circuit 6. The control circuit 6 determines the mode of the operation of each of the data error rate decision circuit 3, the delay determination circuit 4, and the tap coefficient determination circuit 5, which is an equalization mode or a calibration mode. The equalization mode and the calibration mode will be described in detail later. In the first embodiment, in the calibration mode, delay time is adjusted. In the equalization mode, input data is equalized by using the adjusted delay time.

The control circuit 6 detects, for example, power-on to the semiconductor device LS-DFE and operates the data error rate decision circuit 3, the delay determination circuit 4, and the tap coefficient determination circuit 5 so that the DFE 1 operates in the calibration mode. After completion of adjustment of the delay time in the calibration mode, the control circuit 6 operates the data error rate decision circuit 3, the delay determination circuit 4, and the tap coefficient determination circuit 5 so that the DFE 1 operates in the equalization mode. The control on the data error rate decision circuit 3, the delay determination circuit 4, and the tap coefficient determination circuit 5 by the control circuit 6 corresponds to a control signal cntr schematically illustrated in FIG. 8.

To the data error rate decision circuit 3, sampling data D1 to Dn+1 from the first sampling circuit 12 and the delay circuits 14(1) to 14(n+1) is supplied. To the data error rate decision circuit 3, sampling data output from the output terminal Q of the second sampling circuit 13 is supplied as the error signal E1. The delay determination circuit 4 generates delay time information SD(1) to SD(n) on the basis of information from the data error rate decision circuit 3 in the calibration mode and supplies it to the delay register 8 and the variable delay circuits 16(1) to 16(n). The delay register 8 has a plurality of bits corresponding to the variable delay circuits 16(1) to 16(n). In FIG. 1, only bits DD1, DD2, and DDn corresponding to the variable delay circuits 16(1), 16(2), and 16(n) in the plurality of bits of the delay register 8 are illustrated. Each of the bits DD1, DD2, and DDn is comprised of a plurality of bits so that the delay time change range becomes wide.

As will be described later, in the calibration mode, the delay determination circuit 4 changes the values of the delay time information SD(1) to SD(n) so that delay time of each of the variable delay circuits 16(1) to 16(n) becomes proper delay time. Although not limited, when the delay time of each of the variable delay circuits 16(1) to 16(n) becomes a proper value, the delay information SD(1) to SD(n) corresponding to delay time is stored in the corresponding bits DD1 to DDn of the delay register 8. In the first embodiment, the delay time information SD(1) to SD(n) stored in the bits DDI to DDn of the delay register 8 is continuously held in the delay register.

The tap coefficient determination circuit 5 generates tap coefficients TP(1) to TP(n) which are supplied to the multiplication circuits 15(1) to 15(n). The tap coefficient determination circuit 5 generates a buffer control signal BCT controlling the stoppable buffer circuit 10. The tap coefficients TP(1) to TP(n) and the buffer control signal BCT generated are stored in the tap coefficient register 7. The tap coefficient register 7 has a plurality of bits corresponding to the stoppable buffer circuit 10 and the multiplication circuits 15(1) to 15(n), and the buffer control signal BCT and the tap coefficients TP (1) to TP (n) generated by the tap coefficient determination circuit 5 are stored in the corresponding bits and supplied to the stoppable buffer circuit 10 and the multiplication circuits 15(1) to 15(n). In FIG. 1, a bit W0z corresponding to the stoppable buffer circuit 10 and bits W1, W2, and Wn corresponding to the multiplication circuits 15(1), 15(2), and 15(n) are illustrated.

In the calibration mode, the tap coefficient determination circuit 5 sets the tap coefficients TP(1) to TP(n) to predetermined values and sets the stoppable buffer circuit 10 into a stop state by the buffer control signal BCT controlling the stoppable buffer circuit 10. In the equalization mode, the tap coefficient determination circuit 5 determines the tap coefficients TP(1) to TP(n) on the basis of information from the data error rate decision circuit 3 and generates the buffer control signal BCT which operates the stoppable buffer circuit 10.

Next, the operations in the calibration mode and the equalization mode will be described.

Calibration Mode

Figure 2:
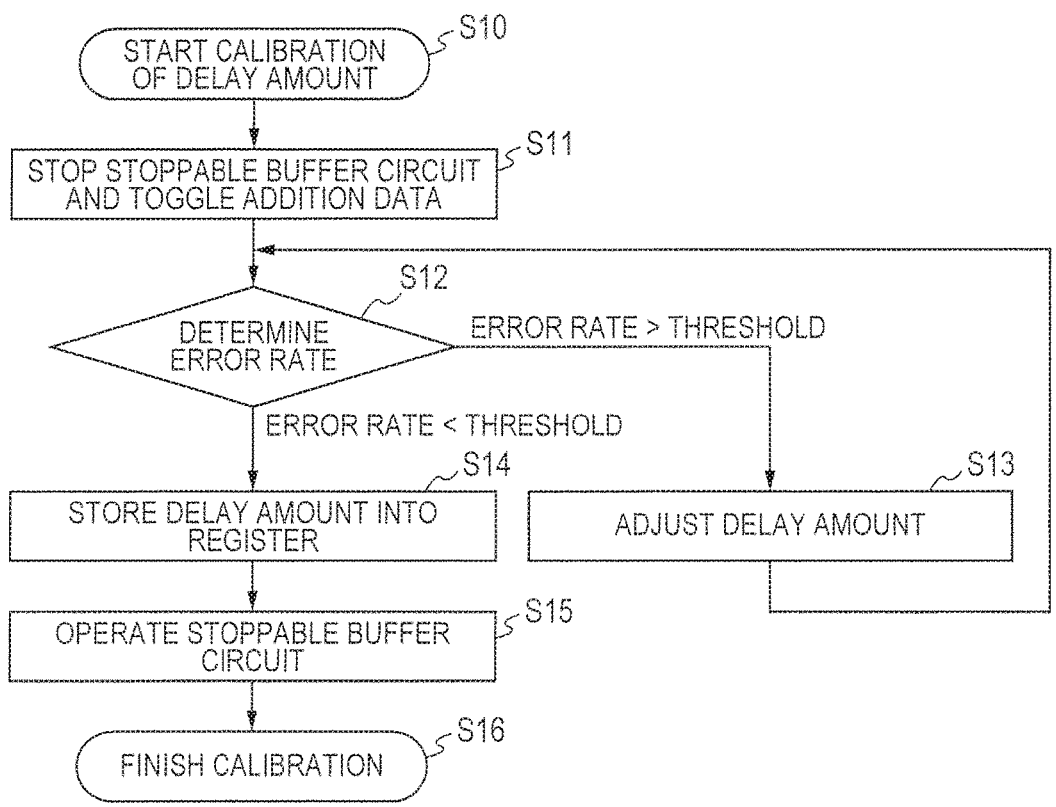
FIG. 2 is a flowchart illustrating operations in a calibration mode according to the first embodiment.

FIG. 2 is a flowchart illustrating operations in the calibration mode according to the first embodiment. Referring to FIGS. 1 and 2, the operations of the DFE 1 in the calibration mode will be described.

When power-on of the semiconductor device LS-DFE is detected, the control circuit 6 illustrated in FIG. 1 executes the calibration mode. In FIG. 2, the DFE 1 starts calibration of adjusting a delay amount (step S10). Next, the DFE 1 executes step S11. In step S11, the control circuit 6 instructs the tap coefficient determination circuit 5 to generate the buffer control signal BCT which stops the stoppable buffer circuit 10 and also to generate the tap coefficients TP(1) to TP(n) each having a predetermined value. An example of the predetermined value of the tap coefficients TP(1) to TP(n) is the largest value (first value).

In response to the above-described instruction, in step S11, the tap coefficient determination circuit 5 generates the buffer control signal BCT which stops the stoppable buffer circuit 10 and generates the tap coefficients TP(1) to TP(n) having the largest value. The generated buffer control signal BCT and the tap coefficients TP(1) to TP(n) are stored in the corresponding bits W0z and W1 to Wn in the tap coefficient register 7. By the operation, in step S11, the stoppable buffer circuit 10 enters a stop state, and the tap coefficients TP(1) to TP(n) having the largest value are supplied to the multiplication circuits 15(1) to 15(n), respectively. When the stoppable buffer circuit 10 is stopped, to the addition circuit 11, the input data D0 from the stoppable buffer circuit 10 is not supplied but only feedback data from the multiplication circuits 15(1) to 15(n) is supplied.

In step S11, the control circuit 6 operates the data error rate decision circuit 3 and the delay determination circuit 4. In this case, the control circuit 6 instructs the delay determination circuit 4 to generate the delay time information SD(1) to SD(n) indicating predetermined delay time. In response to the instruction, the delay determination circuit 4 generates the delay time information SD(1) to SD(n) each indicating predetermined delay time. The predetermined delay time is, for example, shortest delay time which can be set in each of the variable delay circuits 16(1) to 16(n). The generated delay time information SD(1) to SD(n) is supplied to the corresponding variable delay circuits 16(1) to 16 (n). The generated delay time information SD(1) to SD(n) may be stored in the corresponding bits DD1 to DDn of the delay register 8 or may not be stored.

In step S11, when the clock signal SCCK changes, the first and second sampling circuits 12 and 13 sample the waveform of addition data from the addition circuit 11. Since the stoppable buffer circuit 10 is in the stop state at this time, to the addition circuit 11, the waveform of the input data D0 is not supplied but only the waveform of feedback data from each of the multiplication circuits 15(1) to 15(n) is supplied. As a result, the addition circuit 11 adds the feedback data from the multiplication circuits 15(1) to 15(n) to generate addition data. Consequently, in the calibration mode, the waveform of the addition data obtained by adding only the feedback data from the multiplication circuits 15(1) to 15(n) is sampled by the first and second sampling circuits 12 and 13.

The sampling data D1 obtained by sampling of the first sampling circuit 12 is delayed by the variable delay circuit 16(1) only by delay time designated by the delay time information SD(1) and the resultant data is supplied to the multiplication circuit 15(1). In the multiplication circuit 15(1), computation between the tap coefficient TP(1) having the largest value and the delayed sampling data from the variable delay circuit 16(1) is performed, the resultant data is inverted, and the inverted data is supplied as feedback data to the addition circuit 11. Similarly, the sampling data D2 to Dn output from the delay circuits 14(1) to 14(n) is delayed by the variable delay circuits 16(2) to 16(n) only by delay time designated by the delay time information SD(2) to SD(n) and the resultant data is multiplied by the largest tap coefficients TP(2) to TP(n) in the multiplication circuits 15(2) to 15(n), respectively. The results of the multiplication are inverted and the inverted data is supplied as feedback data to the addition circuit 11.

Each time the clock signal SCCK changes, the multiplication circuits 15(1) to 15(n) output the inverted feedback data. Consequently, if the delay time of the variable delay circuits 16(1) to 16(n) is set to a proper value, the waveform of the addition data output from the addition circuit 11 changes in the vertical direction synchronously with the changes in the clock signal SCCK. In the case of seeing the addition data in binary, the data becomes data which alternately toggles between the logical value "1" and the logical value "0" synchronously with the change in the clock signal SCCK. By setting each of the tap coefficients TP(1) to TP(n) to the largest value, the change in the waveform of the addition data output from the addition circuit 11 can be made large.

In step S12, the control circuit 6 instructs the data error rate decision circuit 3 to decide the data error rate. In response to the instruction, the data error rate decision circuit 3 decides the error rate on the basis of the sampling data D1 to Dn+1 output from the first sampling circuit 12 and the delay circuits 14(1) to 14 (n+1) and/or the error signal E1 output from the second sampling circuit 13. When the delay time of the variable delay circuits 16(1) to 16 (n) is properly set and the timing of addition of the feedback data is properly set, the addition data becomes data which alternately changes (toggles) between the logical value "1" and the logical value "O0" synchronously with the clock signal SCCK. When the addition data whose logical value alternately changes as described above is sampled by the first sampling circuit 12 synchronously with the clock signal SCCK, the sampling data D1 also becomes data whose logical value alternately changes between "1" and "0".

The shift register comprised of the delay circuits 14(1) to 14(n+1) shifts the sampling data D1 to generate the sampling data D2 to Dn+1. Consequently, when the delay time of the variable delay circuits 16(1) to 16(n) is properly set, each of the sampling data D2 to Dn+1 also becomes data whose logical value alternately changes between "1" and "0".

The data error rate decision circuit 3 grasps, for example, the rate that the value of each of the sampling data D1 to Dn+1 does not alternately become the logical value "1" and the logical value "0" as the error rate. The hither the rate (error rate) that the value does not become alternately the logical value "1" and the logical value "0" is, the more the delay time set in the variable delay circuits 16(1) to 16(n) is not proper, that is, the timing of addition is not proper. Although grasp of the error rate has been described using the sampling data D1 to Dn as an example, for example, the rate that the logical value of the error signal E1 does not change alternately may be grasped as an error rate, or the error rate may be grasped using both the sampling data D1 to Dn+1 and the error signal E1.

In the first embodiment, a predetermined threshold is set for the error rate. The data error rate decision circuit 3 decides the error rate by comparing a predetermined threshold and the grasped error rate in step S12. When the error rate is larger than the predetermined threshold, the data error rate decision circuit 3 instructs the delay determination circuit 4 to adjust the delay amount (step S13).

In response to the instruction, the delay determination circuit 4 changes the delay time information SD(1) to SD(n). By changing the delay time information SD(1) to SD(n), the delay time in the variable delay circuits 16(1) to 16(n) is changed. For example, by changing the delay time information SD(1) to SD(n) from the shortest delay time which can be set in the variable delay circuits 16(1) to 16(n), the delay time becomes longer. In this case, all of the delay time information SD(1) to SD(n) may be changed or only a part of the delay time information may be changed. After changing the delay time information SD(1) to SD(n), by changing the clock signal SCCK again, new sampling data D1 to Dn+1 and a new error signal E1 according to the changed delay time information SD(1) to SD(n) are supplied to the data error rate decision circuit 3. The stoppable buffer circuit 10 maintains the stop state.

On the basis of the new sampling data D1 to Dn+1 and the new error signal E1, the data error rate decision circuit 3 grasps the error rate again in step S12 and compares it with a predetermined threshold. The steps S12 and S13 are repeated until the error rate becomes smaller than the threshold.

When the error rate becomes smaller than the predetermined threshold, in step S14, the data error rate decision circuit 3 instructs the delay determination circuit 4 so as to store the delay time information SD(1) to SD(n) generated by the delay determination circuit 4 at that time to the bits DD1 to DDn. In response to the instruction, when the error rate is smaller than the threshold, the delay determination circuit 4 stores the generated time information SD(1) to SD(n) to the corresponding bits DD1 to DDn of the delay register 8.

In step S15, the data error rate decision circuit 3 instructs the tap coefficient determination circuit 5 to generate the buffer control circuit BCT which operates the stoppable buffer circuit 10. In response to it, the tap coefficient determination circuit 5 generates the buffer control signal BCT which operates the stoppable buffer circuit 10 and stores it into the bit W0z in the tap coefficient register 7. By the buffer control signal BCT stored in the bit W0z, the stoppable buffer circuit 10 starts operating and can supply the input data D0 to the addition circuit 11.

After step S15, step S16 is executed. The calibration of adjusting delay time is finished in step S15, and the DFE 1 shifts to the equalization mode. At the shift to the equalization mode, the delay time information SD(1) to SD(n) stored in the delay register 8 is maintained, and the buffer control signal BCT stored in the bit W0z in the tap coefficient register 7 is also maintained.

Equalization Mode

The equalization mode is a mode of equalizing the transmission characteristic of the signal line BPB (FIG. 9) in the DFE 1 and shaping the waveform of the input data D0 so that the output data corresponding to the input data D0 supplied to the DFE 1 (in FIG. 8, the input data supplied from the linear amplification circuit VGA) is output.

In the equalization mode, the control circuit 6 makes the data error rate decision circuit 3 and the tap coefficient determination circuit 5 operate. Although not limited, in the first embodiment, in the equalization mode, the delay determination circuit 4 is set in a non-operating state. Although the delay determination circuit 4 is set in the non-operating state, the delay time information SD(1) to SD(n) stored in the delay register 8 is continuously output also in the equalization mode. Similarly, the buffer control signal BCT stored in the bit W0z in the tap coefficient register 7 is also continuously output.

In the equalization mode, the input data D0 is supplied to the addition circuit 11 via the stoppable buffer circuit 10 which is set in the operation state. To the addition circuit 11, feedback data is supplied from each of the multiplication circuits 15(1) to 15(n). The input dataD0 from the stoppable buffer circuit 10 and the feedback data from each of the multiplication circuits 15(1) to 15(n) is added by the addition circuit 11, and addition data obtained by the addition is sampled by the first and second sampling circuits 12 and 13 synchronously with the clock signal SCCK.

The sampling data D1 output from the output terminal Q of the first sampling circuit 12 and the sampling data D2 to Dn output from the output terminals Q of the delay circuits 14(1) to 14(n) is delayed by the variable delay circuits 16(1) to 16(n) only by the delay time expressed by the delay time information SD(1) to SD(n) output from the corresponding bits DDI to DDn of the delay register 8, and the resultant data is supplied to the multiplication circuits 15(1) to 15(n). In the multiplication circuits 15(1) to 15(n), the sampling data D1 to Dn delayed only by the delay time expressed by the delay time information SD(1) to SD(n) is multiplied by the corresponding tap coefficients TP(1) to TP(n). The resultant data is supplied as feedback data to the addition circuit 11.

In the first embodiment, the delay time since the sampling data D1 is output from the output terminal Q of the first sampling circuit 12 until the feedback data corresponding to the sampling data D1 is supplied to the addition circuit 11 or the input terminal DI of the first sampling circuit 12 can be changed by the delay time information SD(1) which is supplied to the variable delay circuit 16(1). Similarly, the delay time since the sampling data D2 to Dn is output from the output terminals Q of the delay circuits 14(1) to 14(n) until the feedback data corresponding to the sampling data D2 to Dn is supplied to the addition circuit 11 or the input terminal DI of the first sampling circuit 12 can be also changed by the delay time information SD(2) to SD(n) which is supplied to the variable delay circuits 16(2) to 16(n), respectively.

By the adjustment in the calibration mode described above, the values of the delay time information SD(1) to SD(n) are set so that the error rate decreases. That is, in the first embodiment, the delay time of the variable delay circuits 16(1) to 16(n) is determined by the delay time information SD(1) to SD(n) so that the feedback data corresponding to the sampling data D1 to Dn is supplied to the addition circuit 11 at the timing that the error rate decreases. Consequently, even when the transfer rates are different, by executing the above-described calibration mode at each of the transfer rates, the feedback data can be supplied to the addition circuit 11 at a timing adapted to the transfer rate, and proper equalization can be performed. As a result, the DFE 1 can generate output data having a waveform more matched to the waveform of the input data.

In the equalization mode, the sampling data D1 to Dn+1 and/or the error signal are supplied from the data error rate decision circuit 3 to the tap coefficient determination circuit 5. The tap coefficient determination circuit 5 generates the tap coefficients TP(1) to TP(n) adapted to perform equalization on the basis of the sampling data D1 to Dn+1 and/or the error signal E1 supplied, and supplies them to the corresponding multiplication circuits 15(1) to 15(n).

Figure 3:
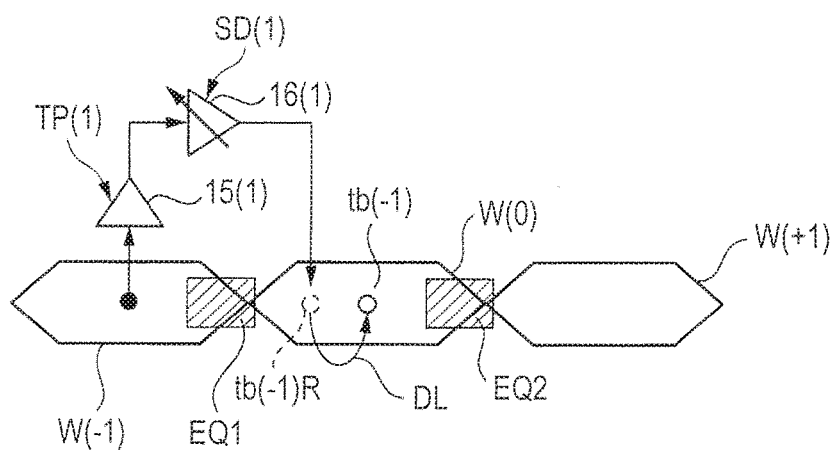
FIG. 3 is an explanatory diagram schematically illustrating operations of the DFE according to the first embodiment.

FIG. 3 is an explanatory diagram schematically illustrating operations of the DFE according to the first embodiment. FIG. 3 is similar to FIG. 12A. Referring to FIG. 3, the difference from the case of FIG. 12A will be described. In FIG. 1, the sampling data is supplied from the variable delay circuit to the multiplication circuit. In FIG. 3, to achieve a match to FIG. 12A, the data is multiplied by the tap coefficient TP(1) by the multiplication circuit 15(1) and, after that, the resultant data is supplied to the variable delay circuit 16(1) and added to the waveform W(0) of the input data. The waveform W(−1) of the input data is multiplied by the tap coefficient TP(1) by the multiplication circuit 15(1), the multiplication result (feedback data) is delayed by the variable delay circuit 16(1) only by delay time expressed by the delay time information SD(1), and the delayed data is added to the waveform W(0) of the input data. As described with reference to FIG. 12A, when the corresponding transfer rate changes, the timing that the multiplication result of the multiplication circuit 15(1) is added becomes tb(−1))R.

On the other hand, in the first embodiment, by executing the calibration at the changed transfer rate, the delay time information SD(1) adapted to the transfer rate is obtained. In the equalization mode, the timing at which the multiplication result is added is changed only by the delay time DL expressed by the obtained delay time information SD(1), and the timing of addition becomes the proper timing tb(−1)). Consequently, proper equalization can be performed. The timing of addition can be prevented from changing to the hatched regions EQ1 and EQ2 in FIG. 3, and erroneous equalization can be also prevented. Although the variable delay circuit 16(1) and the delay time information SD(1) have been described as an example, the operations are similarly performed also with respect to the other variable delay circuits 16(2) to 16(n) and the delay time information SD(2) to SD(n).

As illustrated in FIG. 1, the first sampling circuit 12, the second sampling circuit 13, and the delay circuits 14(1) to 14(n+1) operate synchronously with the clock signal SCCK. When the transfer rate is changed, the frequency of the clock signal SCCK is changed accordingly. Therefore, the cycles of the sampling data D1 to Dn+1 and the error signal E1 also change according to the change of the transfer rate. However, the multiplication circuits 15(1) to 15(n) required to perform high-speed signal process are comprised of analog circuits. Particularly, the multiplication circuit 15(1) generating feedback data corresponding to the sampling data D1 output from the first sampling circuit 12 is requested to perform the highest-speed signal process. By configuring the multiplication circuits 15(1) to 15(n) by analog circuits, delay time in the multiplication circuits 15(1) to 15(n) can be shortened. However, even when the transfer rate changes, the delay time is almost constant, so it is feared that the timing of addition becomes an inadequate timing. On the other hand, in the first embodiment, the timing of addition is changed by the delay time expressed by the delay time information obtained in the calibration mode.

Although the example of providing the multiplication circuits 15(1) to 15(n) at the post stage of the variable delay circuits 16(1) to 16(n) has been described with reference to FIG. 1, the variable delay circuits may be provided at the post stage of the multiplication circuits as illustrated in FIG. 3.

Second Embodiment

Figure 4:
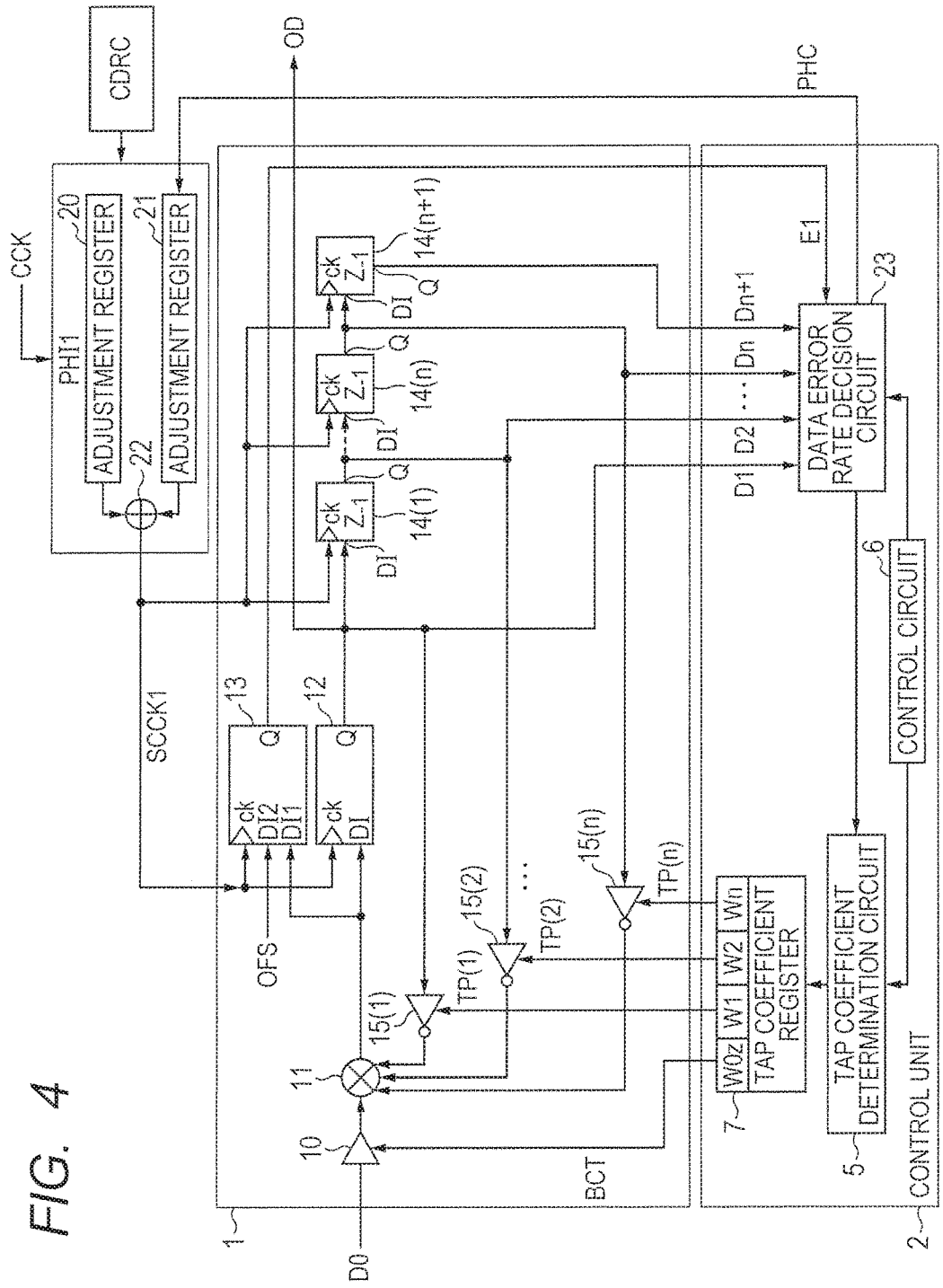
FIG. 4 is a block diagram illustrating the configuration of a DFE according to a second embodiment.

FIG. 4 is a block diagram illustrating the configuration of a DFE according to a second embodiment. Since FIG. 4 is similar to FIG. 1, the different points will be mainly described. Although the DFE 1 has the variable delay circuits 16(1) to 16(n) in FIG. 1, the DFE 1 according to the second embodiment is not provided with the variable delay circuits 16(1) to 16(n). The sampling data D1 to Dn output from the output terminal Q of the first sampling circuit 12 and the output terminals Q of the delay circuits 14(1) to 14(n) is supplied to the corresponding multiplication circuits 15(1) to 15(n). The corresponding tap coefficients TP(1) to TP(n) and the sampling data D1 to Dn are multiplied in the multiplication circuits 15(1) to 15(n), respectively, and resultants of the multiplication are supplied as feedback data to the addition circuit 11.

Although the control unit 2 has the delay determination circuit 4 and the delay register 8 in FIG. 1, it does not has the delay determination circuit 4 and the delay register 8 in the second embodiment. Also in the second embodiment, the control unit 2 has a data error rate decision circuit 23 but, different from the data error rate decision circuit 3 illustrated in FIG. 1, generates a phase adjustment signal PHC on the basis of the sampling data D1 to Dn and/or the error signal E1.

In the second embodiment, the configuration of the phase interpolation circuit is different from that of FIG. 1. The phase interpolation circuit PHI1 illustrated in FIG. 4 has two adjustment registers 20 and 21 and an addition circuit 22. In the adjustment register 20, phase information from a CDR circuit (clock data recovery circuit) is stored. In the adjustment register 21, phase information based on the phase control signal PHC from a data error rate decision circuit 23 is stored. The sum between the phase information stored in the adjustment register 20 and the phase information stored in the adjustment register 21 is obtained by the addition circuit 22. To the phase interpolation circuit PHI1, the clock signal CCK is supplied from the clock generation circuit CGC. The phase of the clock signal CCK is changed according to the value of the sum of the phase information obtained by the addition circuit 22 and the phase of the clock signal CCK is adjusted. In FIG. 4, SCCK indicates the clock signal having the adjusted phase.

The phase information supplied from the CDR circuit CDRC to the adjustment register 20 is, for example, a change amount of changing the phase of the clock signal CCK and the phase information stored in the adjustment register 21 is also a change amount of changing the phase of the clock signal CCK. By the addition circuit 22, the sum of the change amounts is obtained. The phase of the clock signal CCK is changed only by the amount indicated by the sum of the two change amounts, and the resultant signal is output as the clock signal SCCK1 from the phase interpolation circuit PHI1.

In the second embodiment, the change amount stored in the adjustment register 21 is changed or maintained on the basis of the phase adjustment signal PHC output from the data error rate decision circuit 23. For example, when the phase adjustment signal PHC indicates a first state, the change amount stored in the adjustment register 21 decreases or increases, and the decreased or increased change amount is stored in the adjustment register 21. On the other hand, when the phase adjustment signal PHC indicates a second state, the change amount stored in the adjustment register 21 is maintained without being changed. That is, when the phase adjustment signal PHC indicates the first state, the phase of the clock signal SCCK advances (or retards), and the amount of the advanced phase (or the amount of the retarded phase) is determined by the change amount stored in the adjustment register 21. On the other hand, when the phase adjustment signal PHC indicates the second state, the phase of the clock signal SCCK does not change. A configuration of changing the change amount stored in the adjustment register 21 according to the state of the phase adjustment signal PHC can be achieved by, for example, coupling a counter which counts down or up when the phase adjustment signal PHC is in the first state to the adjustment register 21. Obviously, the present invention is not limited to the configuration.

The clock signal SCCK1 generated by the phase interpolation circuit PHI1 is supplied to the clock input terminals ck of the first and second sampling circuits 12 and 13. In the second embodiment, the clock signal SCCK1 is supplied also to the clock input terminals ck of the delay circuits 14(1) to 14(n+1).

Next, the calibration mode executed in the second embodiment will be described.

Calibration Mode

FIG. 5 is a flowchart illustrating operations in the calibration mode according to the second embodiment. In FIG. 5, step S20 is the same as step S10 described in FIG. 2, so that the description will not be repeated. Step S21 is similar to step S11. Specifically, except for the operations of the delay determination circuit 4, the delay register 8, and the variable delay circuits 16(1) to 16(n) described in step S11, the operations in step S21 are the same as those in step S11. Consequently, step S21 will be briefly described. In step S21, the stoppable buffer circuit 10 is set in the stop state. The tap coefficients TP(1) to TP(n) of the predetermined values are generated and supplied to the multiplication circuits 15(1) to 15(n). The clock signal SCCK1 changes cyclically. The addition data supplied to the input terminal DI of the first sampling circuit 12 synchronously with the change in the clock signal SCCK1 becomes data which ideally changes between the logical value "1" and the logical value "0".

Since step S22 is similar to step S12 described in FIG. 2, the different point will be mainly described. The data error rate determination circuit 23 grasps, in a manner similar to the data error rate determination circuit 3, the error rate on the basis of the sampling data D1 to Dn+1 and/or the error signal E1. When the grasped error rate is larger than the predetermined threshold, the data error rate is larger than the predetermined threshold, the data error rate determination circuit 23 generates the phase adjustment signal PHC of the first state. When the grasped error rate is smaller than the predetermined threshold, the data error rate determination circuit 23 generates the phase adjustment signal PHC in the second state. When the phase adjustment signal PHC is in the first state, step S23 is executed after step S22. When the phase adjustment signal PHC is in the second state, step S24 is executed after step S22.

In step S23, the phase amount in the phase interpolation circuit PHI1 is adjusted. By the operation, the phase of the clock signal SCCK1 supplied to the clock input terminals ck of the first sampling circuit 12, the second sampling circuit 13, and the delay circuits 14(1) to 14 (n+1) is adjusted. For example, when the phase adjustment signal PHC becomes the first state, the change amount stored in the adjustment register 21 decreases. Consequently, the change amount obtained by the addition circuit 22 decreases. When the change amount decreases, the phase of the clock signal SCCK1 advances.

When the phase of the clock signal SCCK1 advances, the rising to the high level of the clock signal SCCK1 becomes quicker. As a result, the timing of sampling the waveform of the addition data from the addition circuit 11 supplied to the input terminal DI of the first sampling circuit 12 by the first sampling circuit 12 (the timing of sampling) becomes earlier. On the contrary, when the change amount stored in the adjustment register 21 is increased, the phase of the lock signal SCCK1 is retarded. Consequently, the timing of sampling the waveform of the addition data from the addition circuit 11 supplied to the input terminal DI of the first sampling circuit 12 by the first sampling circuit 12 retards. That is, by the phase adjustment signal PHC from the data error rate decision circuit 23, the timing of sampling the addition data from the addition circuit 11 supplied to the input terminal DI of the first sampling circuit 12 by the first sampling circuit 12 is adjusted.

Eye Pattern of Addition Data

As described in the first embodiment, in the calibration mode, the stoppable buffer circuit 10 is set in the stop state. Each of the multiplication circuits 15(1) to 15(n) generates the inverted multiplication result as feedback data. Consequently, the waveform of the addition data output from the addition circuit 11 becomes, ideally, the waveform of the data in which the logical value "1" and the logical value "0" are alternately generated (toggled).

FIGS. 6A and 6B are waveform charts illustrating operations of the DFE 1 according to the second embodiment. In FIGS. 6A and 6B, the horizontal axis indicates time, and the vertical axis indicates voltage. FIG. 6A illustrates the changes in the voltage at the input terminal DI of the first sampling circuit 12 schematically by an eye pattern. FIG. 6B illustrates the waveform of the clock signal SCCK1 output from the phase interpolation circuit PHI1. FIGS. 6A and 6B illustrate the case of using the DFE 1 adapted to a high transfer rate (for example, standard Gen4) as the DFE 1 of a slow transfer rate (for example, standard Gen1). In this case, it is assumed that the delay time of the multiplication circuit 15(1) is set in conformity with the standard Gen4, and the timing in which the first sampling circuit 12 samples the waveform of addition data supplied to the input terminal DI of the first sampling circuit 12 is set to the timing tf.

Since the multiplication circuit 15(1) is comprised of an analog circuit, even when the transfer rate becomes slow, delay time is almost constant. Consequently, feedback data generated by the multiplication circuit 15(1) is supplied to the addition circuit 11 at an early timing and supplied to the input terminal DI of the first sampling circuit 12. Referring to FIG. 6A, the multiplication circuit 15(1) supplies feedback data generated by multiplying the waveform W(−1) of the input data just before in time with the tap coefficient TP(1) to the addition circuit 11 at the timing of time te. Consequently, the voltage of the waveform W(0) of the input data at present at the input terminal DI of the first sampling circuit 12 changes at an early timing, and the shape becomes a distorted shape which decreases after that (FIG. 6A).

At the fast transfer rate (standard Gen4), in FIG. 6B, even when the clock signal SCCK1 is set to the high level at the time tf, the first sampling circuit 12 can performs sampling when the eye pattern at the input terminal DI is wide open. However, when the transfer rate becomes slow, as illustrated in FIG. 6A, the waveform W(0) of input data is distorted, and the eye pattern starts to be narrowed at the timing of the time tf. Consequently, when the waveform W(0) of the input data is sampled at the timing of the time tf, there is the possibility that equalization is insufficient or erroneous equalization is performed.

In the second embodiment, when it is determined in step S22 that the error rate is higher than the threshold, adjustment of the phase amount in the phase interpolation circuit PHI1 is executed in step S23. Specifically, the phase adjustment signal PHC becomes the first state, and the change amount stored in the adjustment register 21 is decreased. By the operation, the phase of the clock signal SCCK1 supplied to the clock input terminal ck is advanced. That is, as illustrated in FIG. 6B, the clock signal SCCK rises, not at the time tf as illustrated by an alternate long and short dash line but rises at the time te illustrated by a solid line. In the example, the phase advances only by the amount indicated by PHD. The phase amount PHD corresponds to the difference in the change amounts before and after the phase adjustment signal PHC becomes the first state. Consequently, in a state where the eye pattern is open, the first sampling circuit 12 can perform sampling.

After step S23, step S22 is executed again. When it is determined again in step S22 that the error rate is larger than the threshold, the phase adjustment signal PHC indicates the first state, so that the decrease amount of the adjustment register 21 decreases, and the phase of the clock signal SCCK1 further advances. That is, the timing of sampling of the first sampling circuit 12 is advanced. Steps S22 and S23 are repeatedly executed until the error rate becomes smaller than the threshold. When it is determined in step S22 that the error rate is smaller than the threshold, the data error rate determination circuit 23 sets the phase adjustment signal PHC into the second state. By the operation, the adjustment register 21 stores the change amount (delay amount) when the error rate is determined to be smaller than the threshold and holds it (step S24).

Since steps S25 and S26 are the same as steps S15 and S16 in FIG. 2, the description will not be repeated. Since the operations in the equalization mode executed in the DFE 1 according to the second embodiment are similar to those in the equalization mode described in the first embodiment except that there is no delay by the variable delay circuits 16(1) to 16(n), the description will not be repeated.

In the first embodiment, the delay time until the feedback data corresponding to the sampling data reaches the input terminal D1 of the first sampling data 12 is adjusted in accordance with the transfer rate in the calibration rate, and the adjusted delay time is used for equalization of the waveform in the equalization. That is, the delay time of the feedback data corresponding to the sampling data is adjusted. On the other hand, in the second embodiment, the delay time of the feedback data corresponding to the sampling data is not adjusted. The sampling timing in the first sampling circuit 12 is adjusted according to the transfer rate in the calibration mode, and the adjusted sampling timing is used for equalization of the waveform in the equalization mode. That is, in the calibration mode, the timing of the sampling of the first sampling circuit 12 is adjusted so that the sampling data output from the first sampling circuit 12 and the delay circuits 14(1) to 14(n) ideally corresponds to the addition data alternately indicating the logical value "1" and the logical value "0". In the equalization mode, equalization is performed by using the adjusted sampling timing.

In the second embodiment, sampling can be performed at the timing when the eye pattern opens wide in accordance with the transfer rate. Therefore, even when the transfer rates are largely different, erroneous equalization can be prevented, and sampling can be performed at a timing when the effect of waveform equalization is large.

Further, according to the second embodiment, it is unnecessary to provide the feedback loop of feeding back sampling data output from the first sampling circuit 12 to the first sampling circuit 12 via the addition circuit 11. In the case of designing the DFE 1 so as to be confirmed with the Gen4 of the highest transfer rate, it is requested to shorten the delay time of the feedback loop (particularly, the feedback loop including the multiplication circuit 15(1)) so that equalization can be performed even at the highest transfer rate. According to the second embodiment, since it is not requested to provide a feedback loop with a variable delay circuit, rise in the cost can be suppressed. In addition, designing of the multiplication circuit included in the loop of the feedback becomes easier.

In the second embodiment, it can be regarded that the adjustment register 21 and the addition circuit 22 configure an offset circuit of adding an offset to the phase of a clock signal for sampling. In this case, the offset circuit can be comprised of a digital circuit, so that miniaturization can be achieved and rise in the cost can be suppressed.

Third Embodiment

Figure 7:
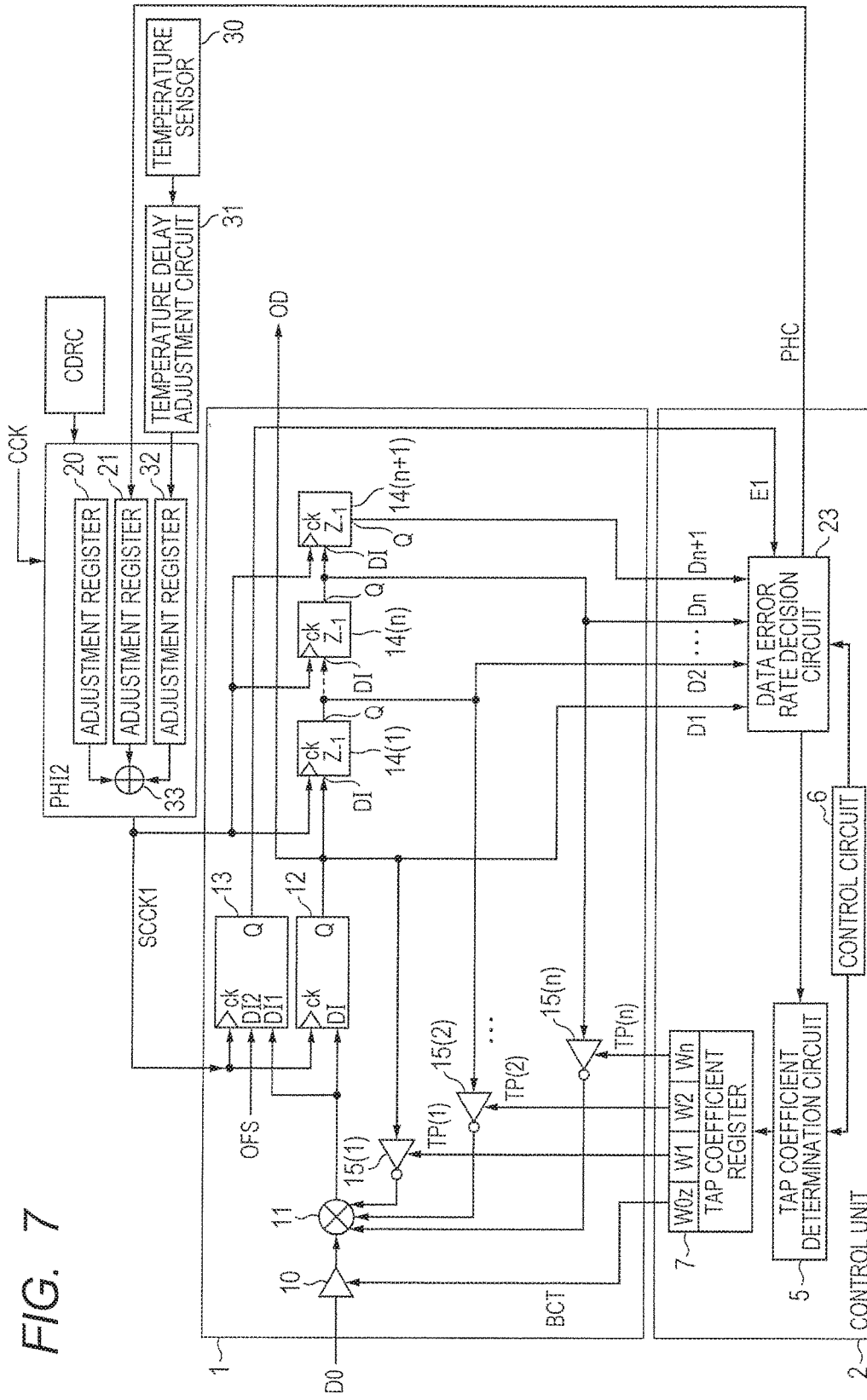
FIG. 7 is a block diagram illustrating the configuration of a DFE according to a third embodiment.

FIG. 7 is a block diagram illustrating the configuration of a DFE according to a third embodiment. Since FIG. 7 is similar to FIG. 4, the different points will be mainly described. Since the DFE and the control unit 2 in FIG. 7 are the same the DFE 1 and the control unit 2 illustrated in FIG. 4, the description will not be repeated.

In FIG. 7, PHI2 indicates a phase interpolation circuit. Like the phase interpolation circuit PHI1 illustrated in FIG. 4, the phase interpolation circuit PHI2 has the adjustment register 20 storing phase information from the CDR CRDC and the adjustment register 21 storing phase information based on the phase adjustment signal PHC. Further, in the third embodiment, the phase interpolation circuit PHI2 has an adjustment register 32 and an addition circuit 33 storing phase information. The phase information stored in the adjustment registers 20, 21, and 32 is the change amount of the phase in a manner similar to the second embodiment.

The addition circuit 33 calculates the sum of change amounts of phases stored in the adjustment registers 20, 21, and 32. On the basis of the calculated sum of the phase amounts, the phase interpolation circuit PHI2 changes the phase of the clock signal CCK supplied and outputs the changed clock signal as a clock signal SCCK1.

In FIG. 7, 30 indicates a temperature sensor, and 31 denotes a temperature delay adjustment circuit. The temperature sensor is formed, for example, on the semiconductor substrate of the semiconductor device LS-DFE illustrated in FIG. 9. Obviously, the present invention is not limited to the configuration. The temperature sensor 30 may be mounted on the outside of the semiconductor device LS-DFE. The temperature sensor 30 generates temperature data which changes according to ambient temperature and supplies it to the temperature delay adjustment circuit 31. The temperature delay adjustment circuit 31 outputs a change amount of a phase corresponding to the temperature data. The change amount of the phase output from the temperature delay adjustment circuit 31 is stored in the adjustment register 32.

Although not limited, the temperature delay adjustment circuit 31 has a table. In this table, pairs of a plurality of pieces of temperature data and change amounts corresponding to the temperature data are registered. When the temperature data is supplied from the temperature sensor 30, the temperature delay adjustment circuit 31 obtains the change amount paired with the supplied temperature data from the table and stores the obtained change amount as the change amount of the phase into the adjustment register 32.

In the table, for example, at the test stage before the semiconductor device LS-DFE is shipped, temperature data and the change amount of the phase at that time is measured, and the change amount paired with the temperature data is registered. For example, in the case of using a DFE designed in conformity with the standard Gen4 as a DFE of the standard Gen1, it is operated in the calibration mode described in the second embodiment. By the above, the change amount adapted to the standard Gen1 is stored in the adjustment register 21. Next, the ambient temperature of the semiconductor device LS-DFE is changed, and temperature data output from the temperature sensor 30 at this time is measured. While changing the change amount stored in the adjustment register 32 at the ambient temperature, the change amount of the adjustment register 32 when the phase adjustment signal PHC output from the data error rate decision circuit 23 changes from the first state to the second state is measured. The measured temperature data and the change amount of the adjustment register 32 are registered as a pair in the table. By repeating the measurement and the registration while changing the ambient temperature, the plurality of pieces of temperature data and change amounts are registered in the table.

Measurement and registration of the temperature data to the table and the change amount is not limited to the above-described method. For example, without using the data error rate determination circuit 23, it is also possible to measure the change amount at which equalization efficient of the DFE 1 at a predetermined temperature and register it into the table.

Temperature data according to the ambient temperature of the semiconductor device LS-DFE is output from the temperature sensor 30, and the change amount corresponding to the ambient temperature at that time is stored from the temperature delay adjustment circuit 31 to the adjustment register 32. Consequently, even when the ambient temperature changes, sampling can be performed at a timing of good equalization efficiency. Further, since the sampling timing is based also on the change amount stored in the adjustment register 21 in the calibration mode, even if the transfer rate varies, sampling can be performed at a timing of good equalization efficiency as described in the second embodiment.

The operations in the calibration mode are requested to be performed before reception of serial data. Consequently, for a change in delay time of the multiplication circuits 15(1) to 15(n) and the like and/or delay time at ambient temperature at that time which occur due to variations in process of manufacturing the semiconductor device LS-DFE, it is possible to obtain a proper sampling timing and adjusting it. According to the third embodiment, also in the case where the ambient temperature changes and delay time changes during reception of serial data, the sampling time can be finely adjusted in accordance with those changes. That is, also in the equalization mode of receiving serial data, the DFE 1 can be maintained in a state where the equalization state is good.

Although the example of finely adjusting the sampling timing in accordance with a change in ambient temperature is illustrated in FIG. 7, the delay time of the variable delay circuits 16(1) to 16(n) described in the first embodiment can be finely adjusted with temperature data from the temperature sensor. It is also possible to provide a plurality of adjustment registers as the adjustment register 32, store change amounts different from one another, and select an adjustment register corresponding to temperature data from the plurality of adjustment registers by the temperature delay adjustment circuit 31 on the basis of temperature data from the temperature sensor 30. In this case, the change amount stored in the selected adjustment register is supplied to the addition circuit 33 and added.

Further, in the adjustment register 21, a proper change value adapted to the transfer rate may be stored before the semiconductor device LS-DFE is shipped. In this case, execution of the calibration mode is not requested, but the sampling timing can be finely adjusted according to a change in the ambient temperature. Therefore, in the equalization mode of receiving serial data, even when the ambient temperature changes, the DFE 1 can be maintained in a state where the equalization efficient is high.

It can be regarded that the calibration mode described in the first to third embodiments is executed by a calibration circuit. In this case, the calibration circuit according to the first embodiment adjusts delay time since the first sampling circuit 12 outputs sampling data from the output terminal Q until feedback data corresponding to the output sampling data (or addition data obtained by addition of a plurality of pieces of feedback data) is supplied to the input terminal DI of the first sampling circuit 12. The calibration circuit according to the second and third embodiments adjusts the sampling timing of the first sampling circuit 12.

When it is regarded that the calibration mode is executed by the calibration circuit, the stoppable buffer circuit (buffer circuit) 10 is stopped by the calibration circuit. Consequently, the input data is not supplied to the addition circuit 11 and it can be regarded that the addition circuit 11 outputs feedback data as addition data for calibration.

It can be regarded that the calibration circuit according to the first embodiment has the variable delay circuits 16(1) to 16(n) and a decision circuit of changing a delay in the variable delay circuits. Referring to FIG. 1, the decision circuit has the data error rate decision circuit 3 and the delay determination circuit 4. The decision circuit changes a delay in the variable delay circuits so that sampling data from the first sampling circuit 12 becomes sampling data corresponding to addition data of the calibration.

In the first to third embodiments, the phase interpolation circuits PHI, PHI1, and PHI2 can be regarded as clock signal generation circuits of generating the clock signals SCCK and SCCK1 supplied to the first sampling circuit 12, the second sampling circuit 13, and the delay circuits 14(1) to 14(n+1).

In the second and third embodiments, in the calibration mode, addition data output from the addition circuit 11 can be regarded as data (reference data) adjusting the sampling timing of the first sampling circuit 12. In such a case, the phase of the first clock signal SCCK1 for sampling supplied to the first sampling circuit is adjusted by the phase interpolation circuits PHI1 and PHI2 so that the sampling data output from the first sampling circuit 12 corresponds to data (reference data) adjusting the sampling timing (delay time).

Although the example of configuring the DFE 1 by an analog circuit and configuring the second unit 2 by a digital circuit has been described in the first to third embodiments, the present invention is not limited to the example. For example, both the DFE 1 and the control unit 2 may be comprised of analog circuits or digital circuits.

Although the present invention achieved by the inventors herein has been concretely described on the basis of the embodiments, obviously, the present invention is not limited by the foregoing embodiments and can be variously modified without departing from the gist.

What is claimed is:

1. A semiconductor device comprising:
   an addition circuit of adding input data and feedback data and outputting addition data;
   a first sampling circuit of sampling the addition data from the addition circuit synchronously with a first clock signal and outputting sampling data;
   a multiplication circuit of multiplying the sampling data from the first sampling circuit by a tap coefficient to generate the feedback data;
   a tap coefficient determination circuit determining the tap coefficient on the basis of the sampling data from the first sampling circuit; and
   a phase adjustment circuit, when reference data for adjusting a timing of sampling of the first sampling circuit is output as the addition data from the addition circuit, of adjusting phase of the first clock signal so that sampling data output from the first sampling circuit corresponds to the reference data.

2. The semiconductor device according to claim 1, further comprising a plurality of delay circuits coupled in series and each operating synchronously with the first clock signal,
   wherein an output of the first sampling circuit is supplied to the delay circuit in a first stage in the plurality of delay circuits coupled in series, and
   wherein the phase adjustment circuit adjusts phase of the first clock signal on the basis of an output of the first sampling circuit and an output of the plurality of delay circuits.

3. The semiconductor device according to claim 1, further comprising a buffer circuit to which the input data is supplied and which supplies the supplied input data to the addition circuit,
   wherein at the time of adjusting a delay time, supply of the input data from the buffer circuit to the addition circuit is stopped, and the feedback data is set as the reference data for adjusting the sampling timing.

4. The semiconductor device according to claim 1, further comprising a temperature sensor of detecting temperature,
   wherein the phase adjustment circuit adjusts the phase of the first clock signal on the basis of temperature data from the temperature sensor.

5. A semiconductor device comprising:
   an addition circuit of adding input data and feedback data and outputting addition data;
   a first sampling circuit of sampling the addition data from the addition circuit and outputting sampling data;
   a multiplication circuit of multiplying the sampling data from the first sampling circuit by a tap coefficient to generate the feedback data;
   a tap coefficient determination circuit determining the tap coefficient on the basis of the sampling data from the first sampling circuit;
   a temperature sensor of detecting temperature; and
   a phase adjustment circuit of changing a timing of sampling of the first sampling circuit on the basis of temperature data from the temperature sensor.

* * * * *